United States Patent
Qiu et al.

(10) Patent No.: US 12,266,405 B2
(45) Date of Patent: Apr. 1, 2025

(54) OPERATION METHOD OF MEMORY, MEMORY, MEMORY SYSTEM, AND ELECTRONIC DEVICE

(71) Applicant: YANGTZE MEMORY TECHNOLOGIES CO., LTD., Wuhan (CN)

(72) Inventors: Lu Qiu, Wuhan (CN); Xueqing Huang, Wuhan (CN); Junyao Zhu, Wuhan (CN); Yao Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 181 days.

(21) Appl. No.: 18/089,420

(22) Filed: Dec. 27, 2022

(65) Prior Publication Data

US 2024/0170070 A1     May 23, 2024

(30) Foreign Application Priority Data

Nov. 18, 2022    (CN) .......................... 202211449092.2

(51) Int. Cl.
G11C 16/16     (2006.01)
G11C 16/08     (2006.01)
G11C 16/10     (2006.01)

(52) U.S. Cl.
CPC ............ *G11C 16/102* (2013.01); *G11C 16/08* (2013.01); *G11C 16/16* (2013.01)

(58) Field of Classification Search
CPC ....... G11C 16/102; G11C 16/08; G11C 16/16; G11C 2211/5648; G11C 11/5628; G11C 11/5671; G11C 16/3427; G11C 16/0483; G11C 16/10
See application file for complete search history.

(56) References Cited

U.S. PATENT DOCUMENTS

2024/0145006 A1 *   5/2024   Zhang ................ G11C 16/3427

* cited by examiner

*Primary Examiner* — Xiaochun L Chen
(74) *Attorney, Agent, or Firm* — BAYES PLLC

(57) ABSTRACT

A memory includes at least a target word line and a first word line group and a second word line group respectively stacked on both sides of the target word line. The first word line group includes first word lines, and the second word line group includes second word lines. A method for operating the memory includes, during a pre-charge operation, applying a first bias voltage signal to the plurality of first word lines, applying a second bias voltage signal to a target word line, and applying a third bias voltage signal to the plurality of second word lines. The method also includes, during a programming operation, applying a program voltage signal to a target word line.

20 Claims, 18 Drawing Sheets

OPERATION METHOD OF MEMORY, MEMORY, MEMORY SYSTEM, AND ELECTRONIC DEVICE

CROSS-REFERENCE TO RELATED APPLICATIONS

This application claims the benefit of priority to Chinese Application No. 202211449092.2, filed on Nov. 18, 2022, which is incorporated herein by reference in its entirety.

TECHNICAL FIELD

The present disclosure generally relates to the technical field of semiconductors, and in particular, to an operation method for a memory, a memory, a memory system, and an electronic device.

BACKGROUND

With the continuous development of electronic technology, the use of memory becomes necessary for many application scenarios in life.

In view of this, it is currently a challenge as to how to ensure the reliability of the programming operation of the memory.

SUMMARY

To solve the above problems or other problems, the present disclosure provides the following technical solutions.

In a first aspect, the present disclosure provides a method for operating a memory. The memory includes at least a target word line and a first word line group and a second word line group stacked on both sides of the target word line, respectively. The first word line group includes a plurality of first word lines, and the second word line group includes a plurality of second word lines. The method includes applying a first bias voltage signal to the plurality of first word lines, applying a second bias voltage signal to the target word line, and applying a third bias voltage signal to the plurality of second word lines, during a pre-charge operation; and applying a program voltage signal to the target word line during a programming operation.

According to the method in accordance with the implementation of the present disclosure, the first bias voltage signal has a first voltage value, the second bias voltage signal has a second voltage value, the third bias voltage signal has a third voltage value, and the first voltage value, the second voltage value, and the third voltage value are different from each other.

According to the method in accordance with the implementation of the present disclosure, the programming operation includes a first sub-programming operation and a second sub-programming operation, the memory further includes a plurality of memory cells, the first word line group includes a first adjacent word line adjacent to the target word line, the second word line group includes a second adjacent word line adjacent to the target word line. The operation method specifically includes performing the first sub-programming operation on the memory cells coupled to the first adjacent word line; performing the pre-charge operation, wherein the first bias voltage signal, the second bias voltage signal, and the third bias voltage signal have a first set of set values; performing the first sub-programming operation on the memory cells coupled to the target word line; performing the first sub-programming operation on the memory cells coupled to the second adjacent word line; performing the pre-charge operation, wherein the first bias voltage signal, the second bias voltage signal, and the third bias voltage signal have a second set of set values; and performing the second sub-programming operation on the memory cells coupled to the target word line. The first set of set values are different from the second set of set values.

According to the method in accordance with the implementation of the present disclosure, a voltage value of the first bias voltage signal is greater than a voltage value of the second bias voltage signal among the first set of set values, and a voltage value of the third bias voltage signal is greater than a voltage value of the second bias voltage signal among the second set of set values.

According to the method in accordance with the implementation of the present disclosure, the programming operation includes a first sub-programming operation and a second sub-programming operation, the memory further includes a plurality of memory cells, the first word line group includes a first adjacent word line adjacent to the target word line, the second word line group includes a second adjacent word line adjacent to the target word line. The method further includes performing the first sub-programming operation on the memory cells coupled to the first adjacent word line; performing the pre-charge operation, wherein the first bias voltage signal, the second bias voltage signal, and the third bias voltage signal have a first set of set values; performing the first sub-programming operation on the memory cells coupled to the target word line; performing the first sub-programming operation on the memory cells coupled to the second adjacent word line; performing the pre-charge operation, wherein the first bias voltage signal, the second bias voltage signal, and the third bias voltage signal have the first set of set values; and performing the second sub-programming operation on the memory cells coupled to the target word line.

According to the method in accordance with the implementation of the present disclosure, the first bias voltage signal, the second bias voltage signal, and the third bias voltage signal are independently controlled during the pre-charge operation.

According to the method in accordance with the implementation of the present disclosure, the memory cells coupled to each of the second word lines are in an erased state, the first bias voltage signal has a first voltage value, the second bias voltage signal has a second voltage value, and the third bias voltage signal has a third voltage value. the first voltage value is greater than the second voltage value; and the second voltage value is equal to the third voltage value.

In a second aspect, the present disclosure provides a memory includes a memory array including at least a target word line and a first word line group and a second word line group stacked on both sides of the target word line respectively, the first word line group includes a plurality of first word lines, the second word line group includes a plurality of second word lines.

The memory also includes a peripheral circuit coupled to the memory array, and configured to apply a first bias voltage signal to the plurality of first word lines, apply a second bias voltage signal to the target word line, and apply a third bias voltage signal to the plurality of second word lines, during a pre-charge operation; and apply a program voltage signal to the target word line during a programming operation.

According to the memory according to the implementation of the present disclosure, wherein the peripheral circuit is further configured to control the first bias voltage signal, the second bias voltage signal, and the third bias voltage signal independently.

According to the memory in accordance with the implementation of the present disclosure, the first bias voltage signal has a first voltage value, the second bias voltage signal has a second voltage value, the third bias voltage signal has a third voltage value, and the first voltage value, the second voltage value, and the third voltage value are different from each other.

According to the memory in accordance with the implementation of the present disclosure, the programming operation includes a first sub-programming operation and a second sub-programming operation, the memory array further includes a plurality of memory cells, the first word line group includes a first adjacent word line adjacent to the target word line, the second word line group includes a second adjacent word line adjacent to the target word line. The peripheral circuit is further configured to perform the first sub-programming operation on the memory cells coupled to the first adjacent word line; perform the pre-charge operation, wherein the first bias voltage signal, the second bias voltage signal, and the third bias voltage signal have a first set of set values; perform the first sub-programming operation on the memory cells coupled to the target word line; perform the first sub-programming operation on the memory cells coupled to the second adjacent word line; perform the pre-charge operation, wherein the first bias voltage signal, the second bias voltage signal, and the third bias voltage signal have a second set of set values; and perform the second sub-programming operation on the memory cells coupled to the target word line. The first set of set values are different from the second set of set values.

According to the memory in accordance with the implementation of the present disclosure, a voltage value of the first bias voltage signal is greater than a voltage value of the second bias voltage signal among the first set of set values, and a voltage value of the third bias voltage signal is greater than a voltage value of the second bias voltage signal among the second set of set values.

According to the memory in accordance with the implementation of the present disclosure, the memory cell can be programmed to be in one of multi-level threshold states.

According to the memory of the implementation of the present disclosure, the multi-level threshold state includes at least a lowest-level threshold state and a highest-level threshold state, in the lowest-level threshold state, the memory has a lowest-level minimum threshold voltage, in the highest-level threshold state the memory has a highest-level maximum threshold voltage, and there is a preset difference value between the highest-level maximum threshold voltage and the lowest-level minimum threshold voltage. The set values of the first bias voltage signal and the second bias voltage signal are related to the preset difference value, and the set values of the third bias voltage signal and the second bias voltage signal are related to the preset difference value.

In a third aspect, the present disclosure provides a memory system including the memory according to any preceding paragraph; and a controller coupled to the memory.

In a fourth aspect, the present disclosure provides an electronic device including the above-mentioned memory system.

According to the present disclosure, hot carrier injection effect can be prevented from occurring in the memory by independently controlling the first bias voltage signal, the second bias voltage signal and the third bias voltage signal, and the reliability of the memory is effectively improved.

BRIEF DESCRIPTION OF THE DRAWINGS

The drawings that are employed in the description of the implementations in accordance with the present disclosure will be briefly introduced below in order to more clearly illustrate the technical solutions of the present disclosure. It is apparent that the drawings in the following description are merely some implementations of the present disclosure. Additional drawings can be obtained for those skilled in the art without any creative effort, based on these drawings.

DETAILED DESCRIPTION

The technical solutions in the implementations of the present disclosure will be described clearly and completely below with reference to the drawings in the implementations of the present disclosure. It is apparent that the described implementations are merely some of the implementations of the present disclosure, but not all of them. All other implementations obtained by one skill in the art based on the implementations in the present disclosure without making creative efforts fall within the scope of protection of the present disclosure.

Figure 1:
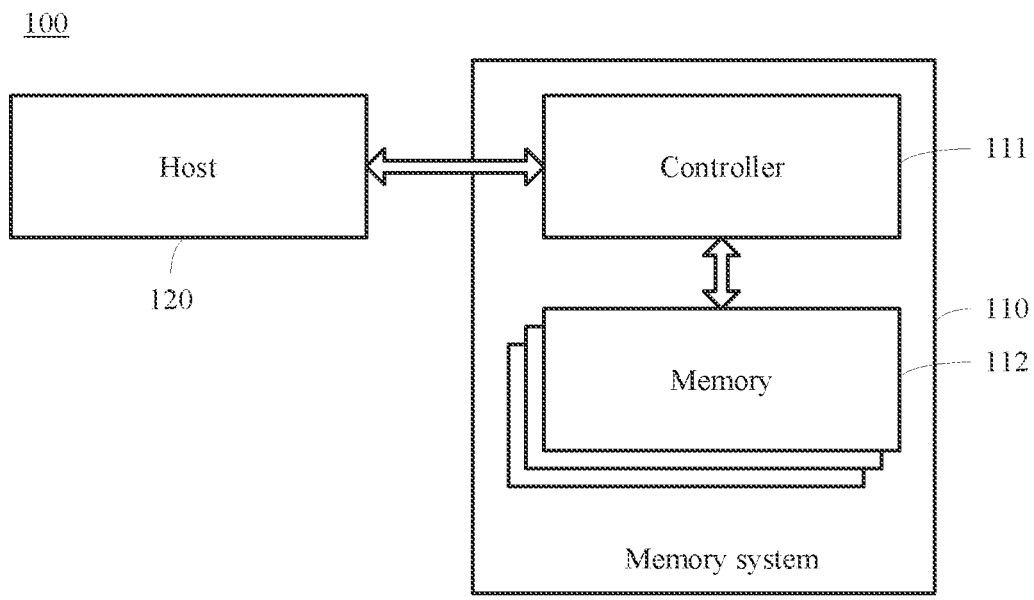
FIG. 1 is a schematic diagram of an exemplary system with a memory system according to an implementation of the present disclosure.

Referring to FIG. 1, which shows a schematic diagram of an exemplary system 100 having a memory system 110 according to an implementation of the present disclosure, the system 100 may be, for example, a mobile phone, desktop computer, laptop computer, tablet computer, vehicle computer, game console, printer, pointing device, wearable electronic device, smart sensor, virtual reality (VR) device, augmented reality (AR) device or any other suitable electronic device having a memory therein. As shown in FIG. 1, the above-mentioned system 100 may at least include a memory system 110 and a host 120. The memory system 110 has a controller 111 and one or more memories 112. The host 120 may be a processor of an electronic device (for example, a central processing unit, CPU) or a system-on-chip (SoC) (for example, an application processor, AP). Specifically, the host 120 can be configured to send data to the memory 112, or receive data from the memory 112.

According to some implementations, the controller 111 is coupled to the memory 112 and the host 120 and is configured to control the memory 112. Further, the controller 111 can manage data stored in the memory 112 and communicate with the host 120. In some implementations, the controller 111 is designed to operate in a low duty cycle environment, which may be a Secure Digital (SD) card, a Compact Flash (CF) card, Universal Serial Bus (USB) flash drives or other media used in electronic devices such as personal computers, digital cameras, mobile phones, and the like. In some implementations, the controller 111 is designed to operate in a high duty cycle environment, which may be a Solid-State Drives (SSD) or an embedded Multi Media Card (eMMC), and can be used as enterprise memory arrays or data storage devices for mobile devices such as smartphones, tablets, laptops, etc.

The controller 111 may be configured to control operations of the memory 112, such as a read operation (Read), an erase operation (Erase), and a programming operation (Program).

Controller 111 may also be configured to manage various functions related to data stored or to be stored in the memory 112, including but not limited to bad block management, garbage collection, logical-to-physical address translation, and wear leveling, among others. In some implementations, the controller 111 is also configured to process error correction code (ECC) associated with data read from or written to the memory 112. In some implementations, the controller 111 may be further configured to perform any other suitable functions, such as formatting the memory 112. Further, in some implementations, the controller 111 is configured to fully or partially execute the operation method described in detail below.

The controller 111 may communicate with external devices (e.g., the host 120) according to a specific communication protocol. As an example, the controller 111 can communicate with external devices through at least one of various interface protocols, and the interface protocols can be protocols such as Universal Serial Bus (USB) protocol, Multi Media Card (MMC) protocol, peripheral component interconnection (PCI) protocol, Peripheral Component Interconnect Express (PCI-E) protocol, Advanced Technology Attachment (ATA) protocol, serial ATA protocol, parallel ATA protocol, Small Computer System Interface (SCSI) protocol, Enhanced Small Device Interface (ESDI) protocol, Integrated Drive Electronics (IDE) protocol, FireWire protocol, etc.

The controller 111 and one or more memories 112 can be integrated into various types of memory devices, for example, in the same package, and further, the package can be, for example, Universal Flash Storage (UFS) package or embedded multimedia card (eMMC) package, etc. That is to say, the memory system 110 can be implemented and packaged into different types of terminal electronic products.

Figure 2A:
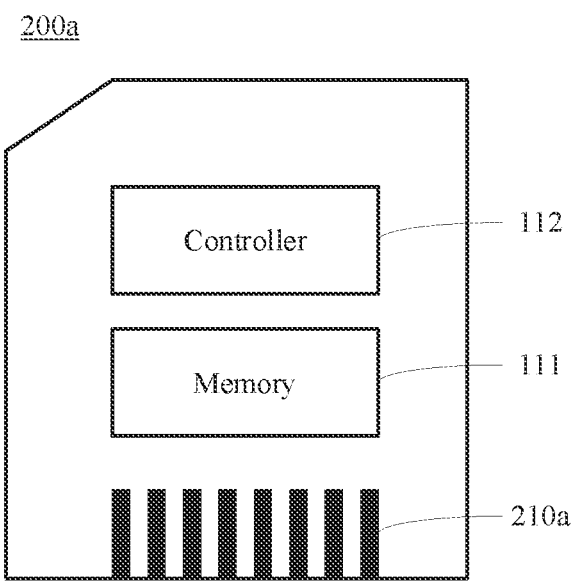
FIG. 2a is a schematic diagram of an exemplary memory card with a memory system according to an implementation of the present disclosure.

For example, in an example shown in FIG. 2a, the controller 111 and the single memory 112 can be integrated in the memory card 200a. Further, the memory card 200a can be, for example, a PC card (Personal Computer Memory Card International Association, PCMCIA), Compact Flash (CF) card, Smart Media (SM) card, Memory Stick, Multimedia Card (including at least: Multimedia (MMC) card, Reduced Size MMC (RS-MMC) card and Multimedia Micro (MMC micro) card), SD card (including at least: Secure Digital (SD) card, Mini-Secure Digital (mini-SD) card, Micro-Secure Digital (micro-SD) card and Secure Digital High Capacity (SDHC) card) and Universal Flash Storage (UFS) card, and/or the like. Further, as shown in FIG. 2a, the memory card 200a may further include a memory card connector 210a that couples the memory card 200a to a host (the host 120 in FIG. 1, for example).

Figure 2B:
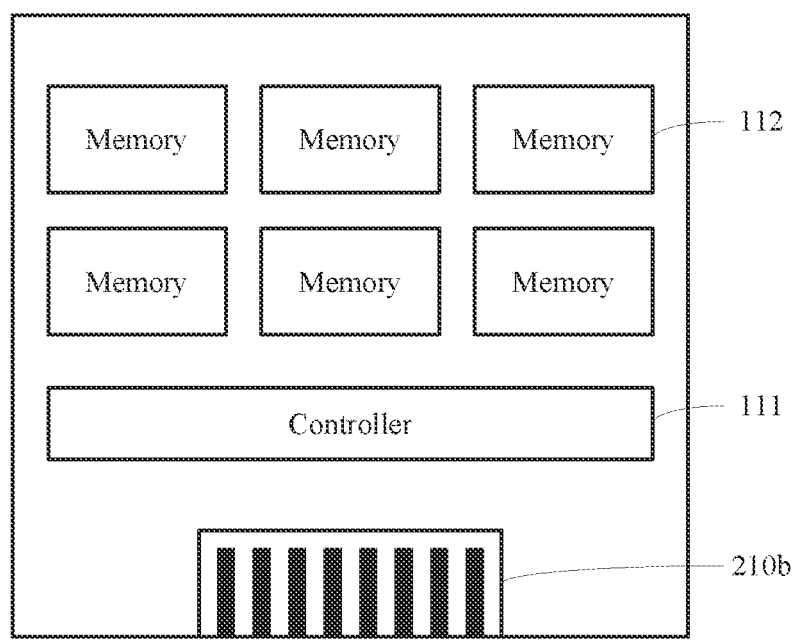
FIG. 2b is a schematic diagram of an exemplary solid-state drive with a memory system according to an implementation of the present disclosure.

As another example, in another example shown in FIG. 2b, the controller 111 and multiple memories 112 may be integrated into a solid-state drive (SSD) 200b. The solid-state drive 200b may further include a solid-state drive connector 210b that couples the solid-state drive 200b to a host (the host 120 in FIG. 1, for example).

In some implementations, the storage capacity and/or operating speed of the solid-state drive 200b is higher than the storage capacity and/or operating speed of the memory card 200a.

It is noted that the memory 112 may be a memory such as a three-dimensional NAND memory (3D NAND Flash). Next, referring to FIG. 3a and FIG. 3b, which illustrate schematic top view and a perspective schematic view of the structural division of a NAND memory 300, respectively.

Figure 3A:
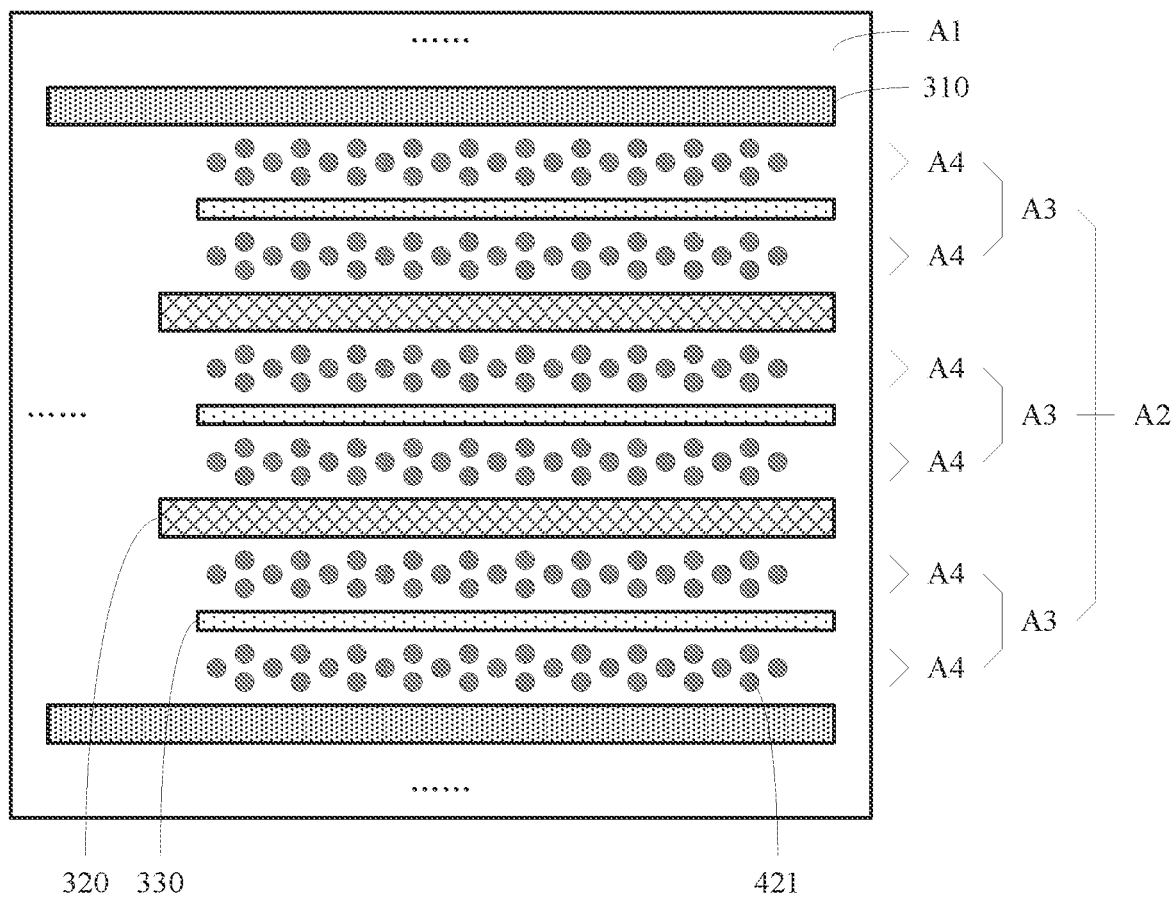
FIG. 3a is a schematic top view of the structural division of a three-dimensional NAND memory according to an implementation of the present disclosure.
Figure 3B:
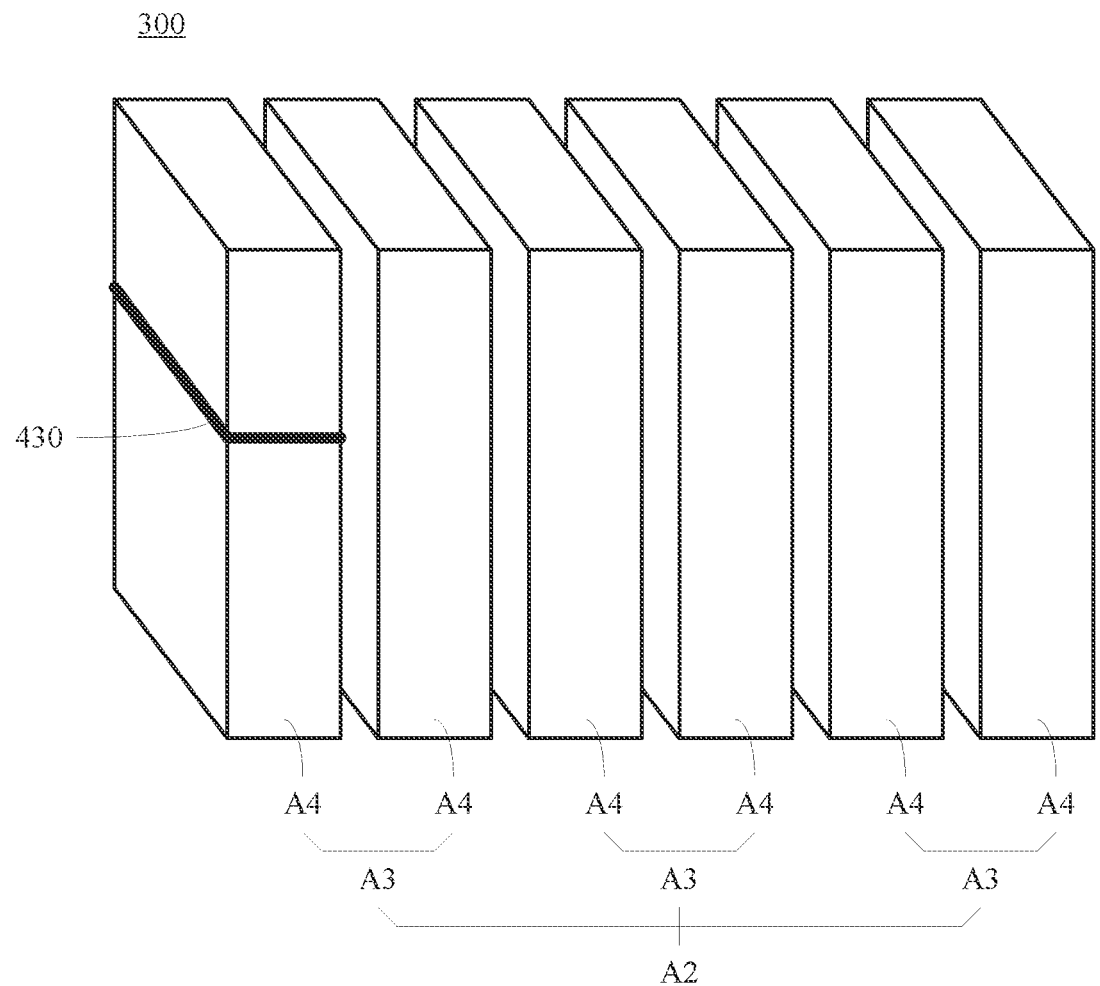
FIG. 3b is a perspective schematic diagram of the structural division of a three-dimensional NAND memory according to an implementation of the present disclosure.

As shown in FIG. 3a and FIG. 3b, the three-dimensional NAND memory 300 has at least a giant block (GB) A1, and includes at least a first gate gap structure 310, a second gate gap structure 320, and a top selection gate gap structure 330. Specifically, the first gate gap structure 310 is arranged in the giant block A1, and is used to divide the giant block A1 into a plurality of memory blocks A2. The second gate gap structure 320 is arranged in the memory block A2, and is used to divide the corresponding memory block A2 into a plurality of fingers A3. The top selection gate gap structure 330 is set in the finger A3, and is used to divide the corresponding finger A3 into a plurality of sub-areas A4. In the example of FIG. 3a and FIG. 3b, a memory block A2 includes three fingers A3, and a finger A3 includes two sub-areas A4. In other words, a memory block A2 includes six sub-areas A4. It is noted that, in practical applications, the number of sub-areas A4 in a memory block A2 is not limited thereto.

Figure 4:
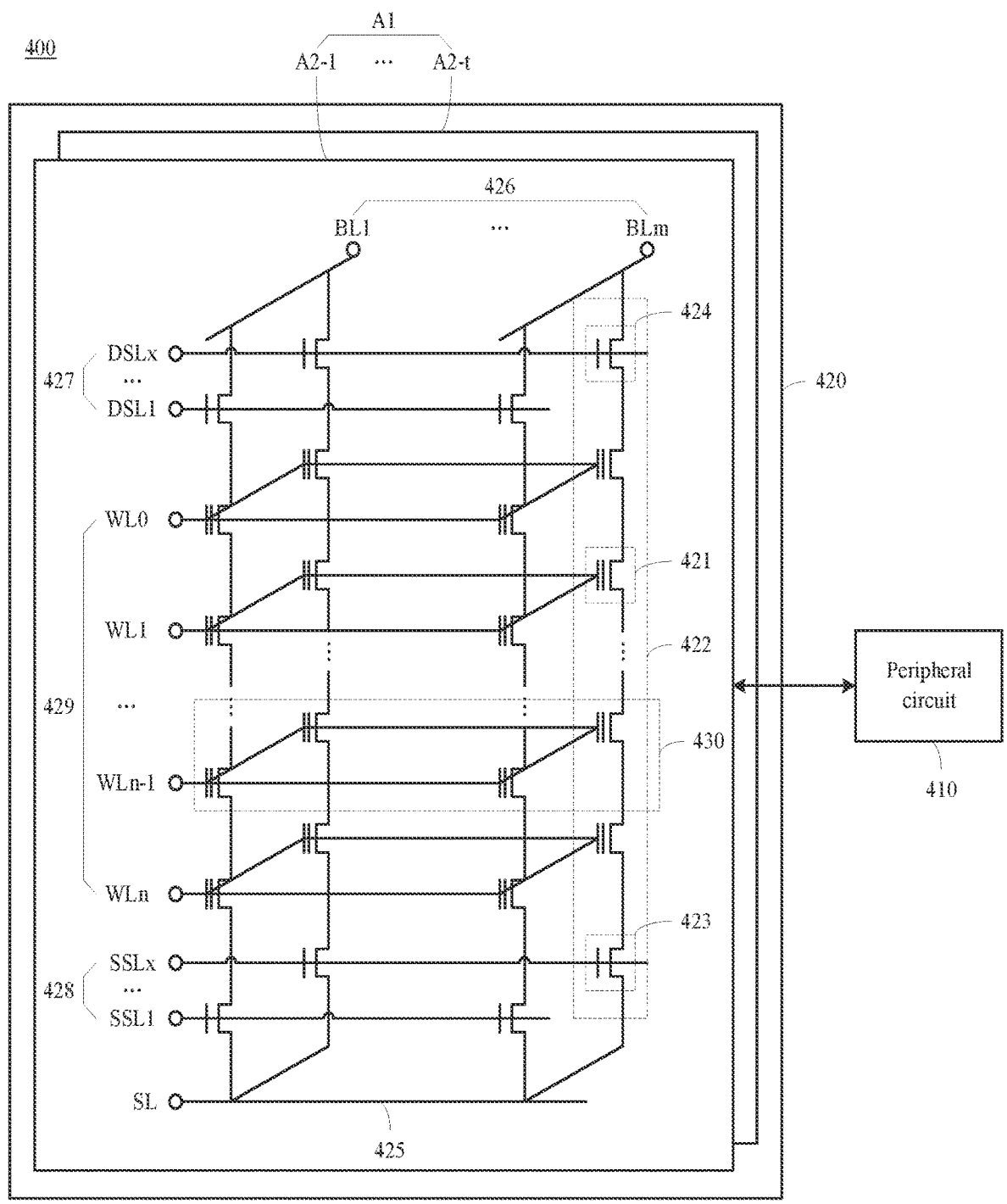
FIG. 4 is a schematic diagram of an exemplary memory including a peripheral circuit according to an implementation of the present disclosure.

With reference to FIG. 4, which shows a schematic diagram of an exemplary memory 400 including a peripheral circuit 410 according to an implementation of the present disclosure, the memory 400 may be an example of the memory 112 in FIG. 1, and the memory 400 may include the peripheral circuit 410 and a memory array 420. Next, description will be made by taking the memory 400 as the above-mentioned three-dimensional NAND memory 300 as an example.

As shown in FIG. 4, in the memory 400, the memory array 420 includes at least a plurality of memory cells 421. Specifically, the memory cells 421 are provided in the form of an array of NAND strings 422, and each NAND string 422 extends vertically above the substrate (not shown in FIG. 4). In some implementations, each NAND string 422 includes a plurality of memory cells 421 coupled in series and stacked vertically. Further, each memory cell 421 may hold a continuous analog value, e.g., voltage or charge, which depends on the number of electrons that each memory cell 421 has trapped within the corresponding area. Specifically, the memory cell 421 may be a floating gate memory cell including a floating gate transistor, or may be a charge trap memory cell including a charge trapping transistor.

In some implementations, each memory cell 421 can be a single-level cell (SLC), where the single-level cell has two-level threshold states, so each single-level cell can store data of one bit. For example, a first-level threshold state of "0" may correspond to a first voltage range, and a second-level threshold state of "1" may correspond to a second voltage range. In other implementations, each memory cell 421 may be a multi-level cell capable of storing more than one bit of data in multi-level threshold states with more than two levels. For example, each memory cell 421 may be Multi Level Cell (MLC) capable of storing data of two bits, may be a Triple Level Cell (TLC) that can store data of three bits, or may be a Quad Level Cell (QLC) that can store data of four bits. Specifically, one of the multi-level threshold states of the memory cell 421 is an erased state.

With continued reference to FIG. 4, each NAND string 422 has a source S and a drain D, and each NAND string 422 includes at least a bottom select gate (BSG) 423 located at the source S and a top select gate (TSG) 424 located at the drain D. The bottom select gate 423 and the top select gate 424 can be configured to activate the selected NAND strings 422 during read and programming operations. Further, the sources S of the NAND strings 422 in the same memory block A2 are coupled through the same source line (SL) 425; that is, all the NAND strings 422 in the same memory block A2 are coupled to the array common source (ACS). Further, the top select gate 424 in each NAND string 422 is coupled to a corresponding bit line (BL) 426 (including bit line BL0 to bit line BLn), and can read data from or write data into the corresponding bit line BL via an output bus (not shown in FIG. 4). In some implementations, each NAND string 422 is configured to have the NAND string 422 to be selected or deselected by applying to corresponding top select gate 424 a select voltage (e.g., high than a threshold voltage of a transistor with the top select gate 424) or a deselection voltage (for example, 0V) via one or more drain select line (DSL) 427, and/or, by applying to corresponding bottom select gate 423 a select voltage (e.g., high than a threshold voltage of a transistor with the bottom select gate 423) or a deselection voltage (for example, 0V) via one or more source select lines (SSL) 428.

As shown in FIG. 4, each memory block A2 includes a plurality of NAND strings 422, and each memory block A2 has a common source line 425 that can be coupled to ground (GND). In some implementations, a memory block A2 is the basic data unit for the erase operation. That is, the data stored in all memory cells 421 in the same memory block A2 will be completely erased in a complete erase operation. When performing an erase operation on the memory cells 421 in the selected memory block A2, an erase voltage (V_erase, which may be, for example, a higher positive voltage, by way of example, 20V or higher) may be applied to the source line 425 of the selected memory block A2. Further, the source line 425 coupled to the selected memory block A2 may be coupled to the unselected memory block A2 at the same time. It should be understood that, in some examples, the above-described erase operation may also be performed at the half-memory block level, at the quarter-memory block level, at a level with any suitable number of memory blocks, or at any suitable fraction of memory blocks.

With continued reference to FIG. 4, and referring to the above-mentioned FIG. 3a and FIG. 3b, in the memory 400, the memory array 420 also includes a plurality of word lines (WLs) 429 (including word line WL0 to word line WLn), and adjacent NAND strings 422 can be coupled via the word line WL. Further, a plurality of memory cells 421 in a sub-area A4 coupled by a word line WL can be called a memory page 430, which is a basic data unit for a programming operation.

Further, the size of a memory page 430 in units of bits may be related to the number of NAND strings 422 coupled to the word line WL in a sub-area A4. Each word line WL may include a control gate (Control Gate, also referred to as "gate electrode") of the memory cell 421 in the corresponding memory page 430, and the control gate may extend laterally as a word line.

Referring back to FIG. 4, in the memory 400, the peripheral circuit 410 may be coupled to the memory array 420 via the bit line BL, the word line WL, the source line 425, the drain selection gate line DSL, and the source selection gate line SSL. Further, the peripheral circuit 410 may include any suitable analog circuit, digital circuit, and mixed-signal circuit to apply voltage signals and/or current signals to selected memory cells 421 (also referred to as "target memory cells") and sensing voltage signals and/or current signals from each target memory cell to perform corresponding operations of the memory array 420 via bit line BL, word line WL, source line 425, drain select gate line DSL and source select gate line SSL. Specifically, the peripheral circuit 410 may include various types of circuits formed using, for example, Metal Oxide Semiconductor (MOS) technology.

Figure 5:
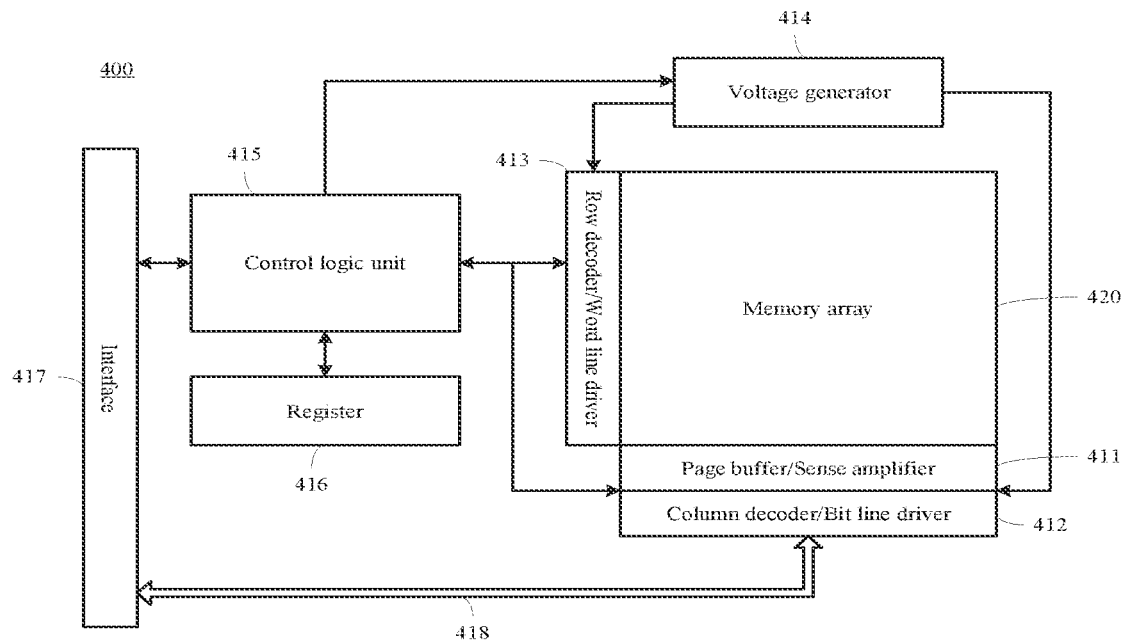
FIG. 5 is a schematic diagram of an exemplary memory including a memory array and a peripheral circuit according to an implementation of the present disclosure.

Referring to FIG. 5, which shows a schematic diagram of an exemplary memory 400 including a memory array 420 and a peripheral circuit 410 according to an implementation of the present disclosure, the peripheral circuit 410 may include at least a page buffer/sense amplifier 411, a column decoder/bit line driver 412, a row decoder/word line driver 413, a voltage generator 414, a control logic unit 415, a register 416, an interface 417 and a data bus 418, as illustrated in FIG. 5. It should be understood that, in some examples, the peripheral circuit 410 may further include other circuits not shown in FIG. 5.

The page buffer/sense amplifier 411 may be configured to read data from and program (also referred to as "write") data into memory array 420 according to control signals from control logic unit 415. Specifically, in one example, the page buffer/sense amplifier 411 may store data to be programmed into one memory page 430 of the memory array 420. In another example, the page buffer/sense amplifier 411 may perform a program verification operation (Verify) to ensure that data has been correctly programmed into the memory cells 421 coupled to the selected word line WL. In yet another example, the page buffer/sense amplifier 411 may further perform an operation of sensing a low power signal from the bit line BL representing the data stored in the memory cell 421 and amplify the small voltage swing of the low power signal to recognizable logic levels during a read operation.

The column decoder/bit line driver 412 may be configured to be controlled by control logic unit 415 and select one or more NAND strings 422 by applying bit line voltages generated from voltage generator 414.

The row decoder/word line driver 413 may be configured to be controlled by the control logic unit 415 to select/deselect the memory block A2 in the memory array 420. The row decoder/word line driver 413 may further be configured to drive the word line WL using the word line voltage generated from the voltage generator 414. In some implementations, the row decoder/word line driver 413 may further perform operations of selecting/deselecting and driving the drain selection gate line DSL and the source selection gate line SSL. As described in detail below, the row decoder/word line driver 413 is configured to perform a programming operation on memory cells 421 coupled to one or more selected word lines WL.

The voltage generator 414 may be configured to be controlled by the control logic unit 415 and generate word line voltages (e.g., read voltages, program voltages, pass voltages, local voltages, verify voltages, etc.), bit line voltages and source line voltages, which are to be supplied to the memory array 420.

The control logic unit 415 may be coupled with each circuit in the peripheral circuit 410 as described above, such as page buffer/sense amplifier 411, column decoder/bit line driver 412, row decoder/word line driver 413, and voltage generator 414, and control the operation of each circuit.

The register 416 may be coupled to the control logic unit 415, and may include at least a state register, a command register, and an address register to store state information, command operation code (OP code), and command address for controlling the operation of each of the above circuits.

Interface 417 may be coupled to control logic unit 415 and serve as a control buffer to perform operations of buffering control commands received from a host (not shown in FIG. 5) and relaying the command to the control logic unit 415, as well as operations of buffering the state information received from the control logic unit 415 and relaying the command to the host. Further, the interface 417 can be further coupled to the column decoder/bit line driver 412 via the data bus 418, and serve as a data Input/Output (I/O) interface and a data buffer to perform operations of buffering of data and relaying data to the memory array 420 as well as operation of relaying or buffering data from the memory array 420.

Figure 6A:
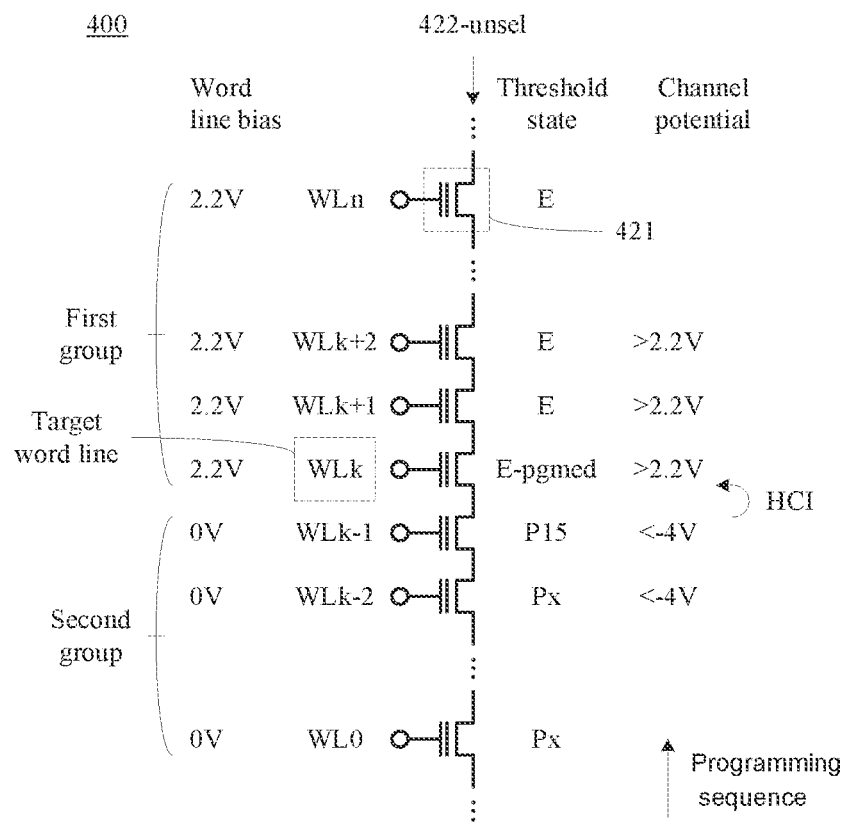
FIGS. 6a to 6b are schematic structural diagrams of a memory including threshold state flags of memory cells in a NAND string during a pre-charge operation in some implementations.
Figure 6B:
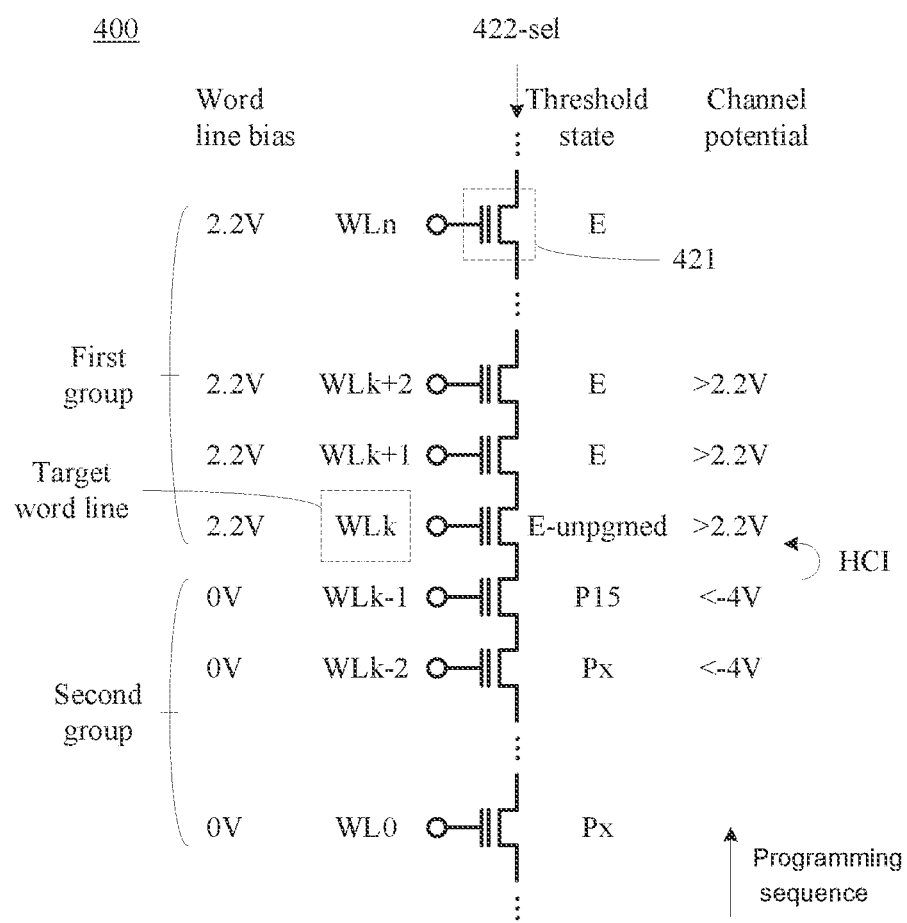

Next, referring to FIG. 6a to FIG. 6b, which show a schematic structural diagram of a memory including threshold state flags of memory cells 421 in the NAND string (422-unsel and 422-sel) in the pre-charge operation in some implementations.

It is noted that, in the process of performing the above-mentioned programming operation on the selected memory block A2 in the memory 400, one word line WL can be selected as the target word line WLk from the plurality of word lines 429 according to a preset sequence, and programming operations may be performed on a plurality of memory pages 430 coupled to the target word line WLk. In the example of FIG. 6a to FIG. 6b, the sequence of selecting the target word line WLk and performing the programming operation may be as follows: first, select the word line WL0 as the target word line WLk, perform the programming operation on the plurality of memory pages 430 coupled to the word line WL0, then select the word line WL1 adjacent to the word line WL0 as the target word line WLk, and perform the programming operation on a plurality of memory pages 430 coupled to the word line WL1, and so on, until the word line WLn is selected as the target word line WLk, a programming operation is performed on a plurality of memory pages 430 coupled to the word line WLn.

Further, as shown in FIG. 3b and FIG. 4, each word line WL in the memory 400 is coupled to multiple memory pages 430 in the same memory block A2 in some implementations, and as described above, a memory page 430 is a basic data unit for performing a programming operation. Therefore, in the process of performing a programming operation on a plurality of memory pages 430 coupled to the target word line WLk, it is also necessary to sequentially select one of multiple sub-areas (String) A4 in the selected memory block A2 as the selected sub-area A4 according to a preset order, and then turn on the top selection gate 424 in the selected sub-area A4 to perform the programming operation on the memory page 430 in the selected sub-area A4 that is coupled to the target word line WLk.

For the convenience of description, in the above-mentioned selected memory block A2, the memory page 430 in the selected sub-area A4 that is coupled to the target word line WLk is referred as "selected memory page 430", the sub-area A4 other than the selected sub-area A4 is referred as "unselected sub-area A4", and the memory page 430 other than the selected memory page 430 is referred as "unselected memory page 430". It should be understood that the program states of the memory cells 421 in each unselected memory page 430 may include "the programming operation has been performed" and "the programming operation has not been performed".

It should be further explained that the programming operation performed on the target memory cells in the selected memory page 430, specifically by applying a program voltage to the target word line WLk, makes electrons in the channel of the target memory cell tunnel to a floating gate to enable the target memory cell to have the corresponding threshold state.

For memory cells other than the target memory cell coupled to the above target word line WLk, it is necessary to avoid the occurrence of program disturbance, and in particular, to avoid program voltage applied to the target word line WLk from inducing electrons in channels of other memory cells to tunnel to the floating gate, which would result in the problem that other memory cells have an undesired threshold state. Therefore, to address the above problem, a pre-charge operation (pre-charge) will be performed first before the program voltage is applied to the target word line WLk to perform the programming operation, in some implementations. Specifically, the pre-charge operation may include at least: precharging a certain voltage to the channel of the other memory cells as described above at bit line BL or source line 425 coupled to the NAND string 422 where other memory cells are positioned. It is noted that since the above operations can increase the channel potentials of other memory cells, it can be ensured that the program voltage applied to the target word line WLk cannot cause electrons in the channels of other memory cells to tunnel to the floating gate during programming operation, so as to avoid the occurrence of program disturbance.

Further, in the example of FIG. 6a to FIG. 6b, the target word line WLk and the plurality of word lines 429 located on one side of the target word line WLk and to which the memory cell 421 that has not been programmed is coupled are taken as a first group, and the rest of the word lines 429 are taken as a second group. As shown in FIG. 6a to FIG. 6b, the first group includes: target word line WLk, word line WLk+1, word line WLk+2 to word line WLn, and the second group includes: word line WLk−1, word line WLk−2 to word line WL0. Specifically, the pre-charge operation further includes: applying a bias voltage equivalent to the power supply voltage (2.2V, for example) to each word line WL in the first group, and applying a bias voltage equivalent to the ground voltage (0V, for example) to each word line WL in the second group.

It is to be noted that, since the above-mentioned channel potential is not only related to the voltage precharged at the bit line BL or the source line 425, but also related to voltage difference between the bias voltage on each word line WL and threshold voltages corresponding to threshold state of the respective memory cell 421. Therefore, compared with the implementation in which a bias voltage equivalent to the ground voltage is applied to the word line WL0 to the word line WLn in the pre-charge operation, in the example of FIG. 6a to FIG. 6b, applying a bias voltage equivalent to the power supply voltage to the word line WL corresponding to the memory cell 421 that has not been programmed can increase the above-mentioned voltage difference, thus further increasing the potential in the channel of the memory cell 421. Therefore, in the subsequent programming operation, the problem of program disturbance in the memory cell 421 can be further avoided.

FIG. 6a shows a possible schematic structural diagram of a memory 400 including the threshold state flags of each memory cell 421 in a NAND string 422-unsel during pre-charge operation, where the NAND memory string 422-unsel is one of the plurality of NAND strings 422 in the "unselected sub-area A4" mentioned above.

Specifically, in the NAND string 422-unsel, the memory cells 421 coupled to the word line WLk+1, word line WLk+2 to word line WLn are in the erased state where no programming operation has been performed. Therefore, the threshold states of these memory cells 421 are marked as "E" in FIG. 6a, and the memory cells 421 coupled to the word line WLk−2 to word line WL0 are in one of the multi-level threshold states. Therefore, the threshold states of these memory cells 421 are marked as "Px" in FIG. 6a.

Further, in the NAND string 422-unsel, the memory cell 421 coupled to the target word line WLk has been programmed, and programmed into the erased state. Therefore, the threshold state of the memory cell 421 is marked as "E-pgmed" in FIG. 6a. Further, in the example of FIG. 6a, the memory cell 421 coupled to the word line WLk−1 has been programmed, and programmed into the highest threshold state of the multi-level threshold state, and FIG. 6a is depicted by taking each memory cell 421 as a quad-level cell (QLC) as described above. Therefore, in FIG. 6a, the threshold state of the memory cell 421 is marked as "P15".

The inventors of the present disclosure found that, as shown in FIG. 6a, the voltage difference between the bias voltage (2.2V) applied to the target word line WLk, and the threshold voltage corresponding to the threshold state (E-pgmed) of the memory cell 421 coupled thereto causes a channel potential greater than 2.2V at the corresponding channel, and the voltage difference between the bias voltage (0V) applied to the word line WLk−1 and the threshold voltage corresponding to the threshold state (P15) of the memory cell 421 coupled thereto causes the channel potential being less than −4V at the corresponding channel. In this case, the channel potential difference value (as shown in FIG. 6a, at least 6.2V) between the adjacent two memory cells 421 in the NAND string 422-unsel (i.e., memory cells 421 coupled to the target word line WLk and the word line WLk−1, respectively) is large, which enables stronger electric field in the channel, thus making the hot carriers in the channel can be injected from the low potential into the high potential. Specifically, as shown in FIG. 6a, the above hot carrier injection (HCI) effect occurs in a direction in which the channel of the memory cell 421 coupled to the word line WLk−1 points to the channel of the memory cell 421 coupled to the target word line WLk. The above-mentioned hot carrier injection effect will lead to an increase in the threshold voltage of the programmed memory cell 421 coupled to the target word line WLk, and will further cause a relatively low small read window during a subsequent read operation performed thereon.

Referring to FIG. 6, which shows another possible schematic structural diagram of the memory 400 including the threshold state flags of each memory cell 421 in the NAND string 422-sel in the pre-charge operation, the NAND string 422-sel is one of the plurality of NAND strings 422 in the "selected sub-area A4" mentioned above.

Compared with the example of FIG. 6a, in the NAND string 422-sel shown in FIG. 6b, except that the threshold state of the memory cell 421 coupled with the target word line WLk is different than the threshold states of the corresponding memory cell 421 in the NAND string 422-unsel, the threshold states of the other memory cells 421 are the same as the threshold states of the corresponding memory cells 421 in the NAND memory string 422-unsel. Therefore, the flags of the threshold states of each memory cell 421 in FIG. 6a and FIG. 6b are also the same, and will not be repeated here.

Specifically, although the sub-area A4 to which the NAND string 422-sel belongs is the selected sub-area A4, the memory cell 421 coupled to the target word line WLk in the NAND string 422-sel is in an erased state where no programming operation has been performed during the pre-charge operation. The threshold state of the memory cell 421 is therefore marked as "E-unpgmed" in FIG. 6b.

It is noted that, in the example of FIG. 6b, the hot carrier injection effect described above also occurs in the direction in which the channel of the memory cell 421 coupled to the word line WLk−1 points to the channel of the memory cell 421 coupled to the target word line WLk. Thus, after the memory cell 421 coupled to the target word line WLk is programmed to the target threshold state, its actual threshold voltage is greater than the target threshold voltage corresponding to the target threshold state, and further leads to a smaller read window during subsequent read operations performed thereon.

Figure 9:
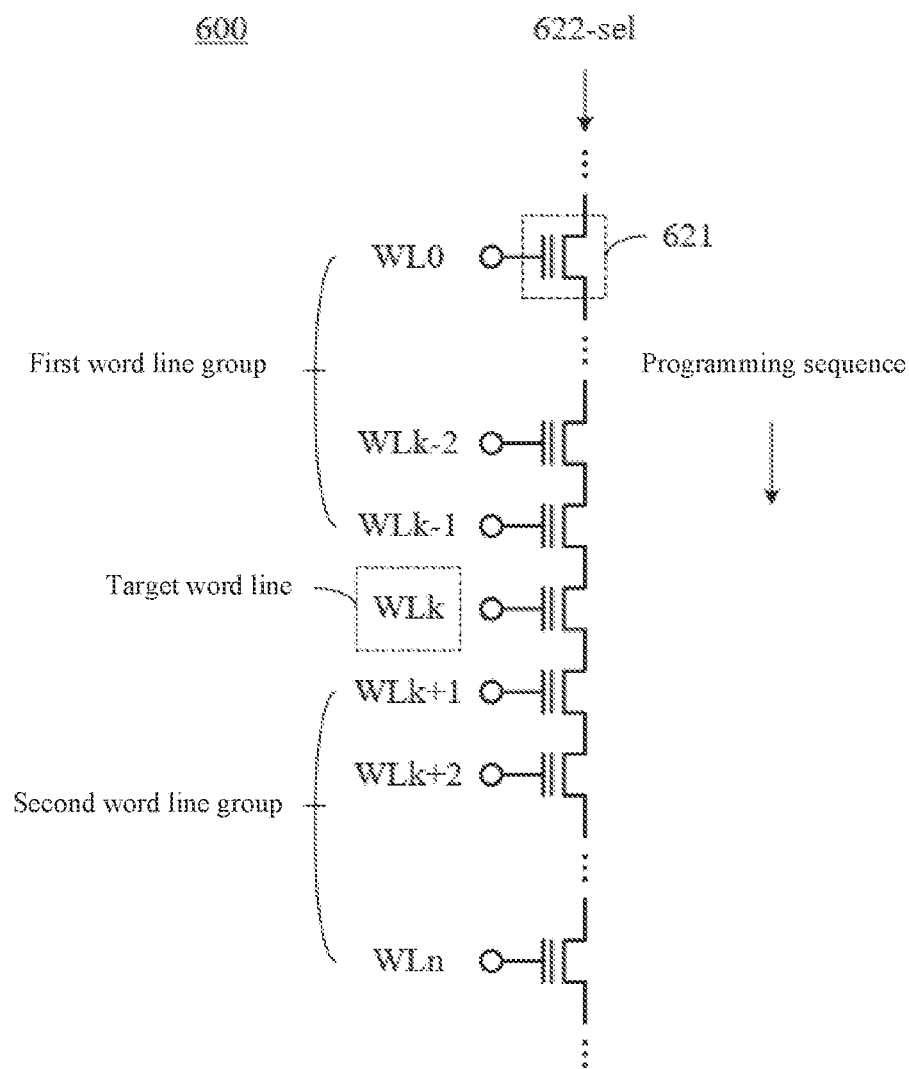
FIG. 9 is a schematic structural diagram of a memory including a NAND string during a pre-charge operation according to an implementation of the present disclosure.
Figure 11:
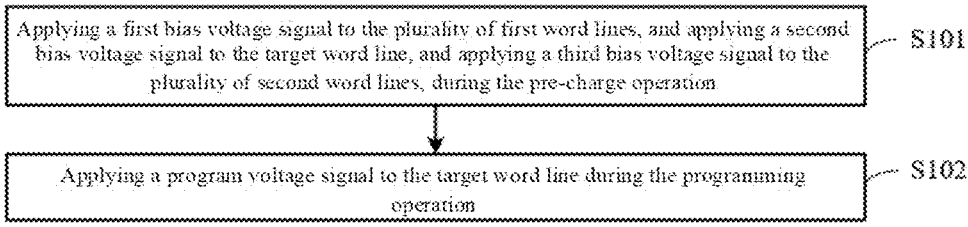
FIG. 11 is a schematic flowchart of an operation method according to an implementation of the present disclosure.

Next, referring to FIG. 9 and FIG. 11, FIG. 9 shows a schematic structural diagram of a memory 500 including a NAND string 622-sel in a pre-charge operation according to an implementation of the present disclosure, and FIG. 11 shows a schematic flow chart of an operation method according to an implementation of the present disclosure.

The inventors of the present disclosure have proposed an operation method for a memory 500 to solve the problems described above and other problems. As shown in FIG. 9, the memory 500 includes at least a target word line WLk and a first word line group and a second word line group respectively stacked on both sides of the target word line WLk. Specifically, the first word line group includes a plurality of first word lines (including word line WLk−1, word line WLk−2 to word line WL0), and the second word line group includes a plurality of second word lines (including word line WLk+1, word line WLk+2 to word line WLn). Further, as shown in FIG. 11, the operation method includes at least the following steps:

Precharging step S101: applying a first bias voltage signal to the plurality of first word lines (word line WLk−1, word line WLk−2 to word line WL0), and applying a second bias voltage signal to the target word line WLk, and applying a third bias voltage signal to the plurality of second word lines (word line WLk+1, word line WLk+2 to word line WLn), during the pre-charge operation; and, Programming step S102: applying a program voltage signal to the target word line WLk during the programming operation.

Specifically, the memory cells coupled to each second word line are in the erased state, the first bias voltage signal has a first voltage value V1, and the second bias voltage signal has a second voltage value V2, and the third bias voltage signal has a third voltage value V3, where the first voltage value V1 is greater than the second voltage value V2, and the second voltage value V2 is equal to the third voltage value V3, in the implementation of the present disclosure as shown in FIG. 9.

It is noted that the inventors of the present disclosure found that in the memory, when the channel potential difference between two adjacent memory cells in the same NAND string exceeds a certain threshold voltage value, the above-mentioned hot carrier injection effect will be induced. Further, for memories with different process sizes, or applied at different ambient temperatures, the above threshold voltage values are not completely the same. Specifically, compared to a threshold voltage value of a memory with a larger process size, the threshold voltage value of the memory with a smaller process size is smaller, and compared with a threshold voltage value of a memory applied at a higher ambient temperature, the threshold voltage value of the memory applied at a lower ambient temperature is larger.

It should be further explained that the voltage difference value between the first voltage value V1, and the second voltage value V2 designed by the inventors of the present disclosure can make the channel potential difference between two adjacent memory cells 421 (i.e., the memory cell 421 coupled to the target word line WLk and the memory cell 421 coupled to the word line WLk−1, as shown in FIG. 9) to be controlled within the threshold voltage value as mentioned above, thereby avoiding the occurrence of the hot carrier injection effect as discussed above.

To ensure that there is the largest difference value between the threshold voltages of the above-mentioned two adjacent memory cells 421 (hereinafter referred to as "preset difference value"), the set first and second voltage values V1 and V2 can be used to avoid the occurrence of the above-mentioned hot carrier injection effect. Therefore, taking each memory cell 421 in the memory 500 as the quad-level cell (QLC) described above as an example, when the memory cell 421 coupled to the target word line WLk is programmed into the minimum threshold voltage in the erased state E (for convenience of description, its threshold voltage is denoted as V_E), and the memory cell 421 coupled to the word line WLk−1 is programmed into a maximum threshold voltage in the highest-level threshold state P15 of the multi-level threshold state (for convenience of description, the threshold voltage is denoted as V_P15), there is the aforementioned preset difference value between the threshold voltages of the two adjacent memory cells 421. In this case, the setting values of the first bias voltage signal and the second bias voltage signal (i.e., the first voltage value V1 and the second voltage value V2) can specifically satisfy the following relationship: $|(V1-V\_P15)-(V2-V\_E)|<|$threshold voltage value$|$. The above equation is transformed to obtain the following relationship: $|(V1-V2)-(V\_P15-V\_E)|<|$threshold voltage value$|$.

That is to say, there is a target difference value between the first voltage value V1 and the second voltage value V2, and the absolute value of the difference value between the target difference value and the preset difference value is smaller than the absolute value of the aforementioned threshold voltage value.

It should be understood that, as described above, the memory cell 421 can be programmed to be in one of multi-level threshold states, which include at least the lowest threshold state (denoted as "Pmin") and the highest threshold state (denoted as "Pmax"), in which the lowest threshold state Pmin has the lowest-level minimum threshold voltage (denoted as "V_Pmin"), the highest threshold state Pmax has the highest-level maximum threshold voltage V_Pmax, and there is a preset difference value between the highest-level maximum threshold voltage V_Pmax and the lowest-level minimum threshold voltage V_Pmin. In this implementation, the set values of the first bias voltage signal and the second bias voltage signal (i.e., the first voltage value V1 and the second voltage value V2) is related to the above-mentioned preset difference value. Furthermore, the memory 500 to which the memory cell 421 belongs has a target process size and will be applied at a target ambient temperature, and has the target threshold voltage value for inducing the above-mentioned hot carrier injection effect. Therefore, the first voltage value V1 and the second voltage value V2 are further related to the target threshold voltage value, and can satisfy the following relationship: $|(V1-V2)-(V\_Pmax-V\_Pmin)|<$target threshold voltage value$|$.

Next, referring to FIG. 7a to FIG. 7f, which show the schematic structural diagram of the memory 400 including the threshold state flags of each memory cell in the NAND string 522-sel in the pre-charge operation according to some implementations, the NAND string 522-sel is one of the multiple NAND strings in the "selected sub-area A4" mentioned above.

It is noted that in the examples shown in FIG. 7a to FIG. 7f, the programming operation performed on each memory cell 421 of the memory 400 includes a first sub-programming operation (also called "coarse programming operation," Coarse Program) and a second sub-programming operation (also called "fine programming operation," Fine Program). Specifically, when a memory cell 421 needs to be programmed to the target threshold state, the memory cell 421 is programmed from the erased state into an intermediate threshold state in the first sub-programming operation, and the intermediate threshold state is between the erased state and the target threshold state. Next, in the second sub-programming operation, the memory cell 421 is programmed from the intermediate threshold state into the target threshold state. Further, in this programming mode, the first sub-programming operation and the second sub-programming operation of the adjacent word line WL will be performed in sequence. That is, in the example shown in FIG. 7a to FIG. 7f, the order in which the target word line WLk is selected and programming operations are performed is different compared to the examples of FIGS. 6a to 6b.

Figure 8:
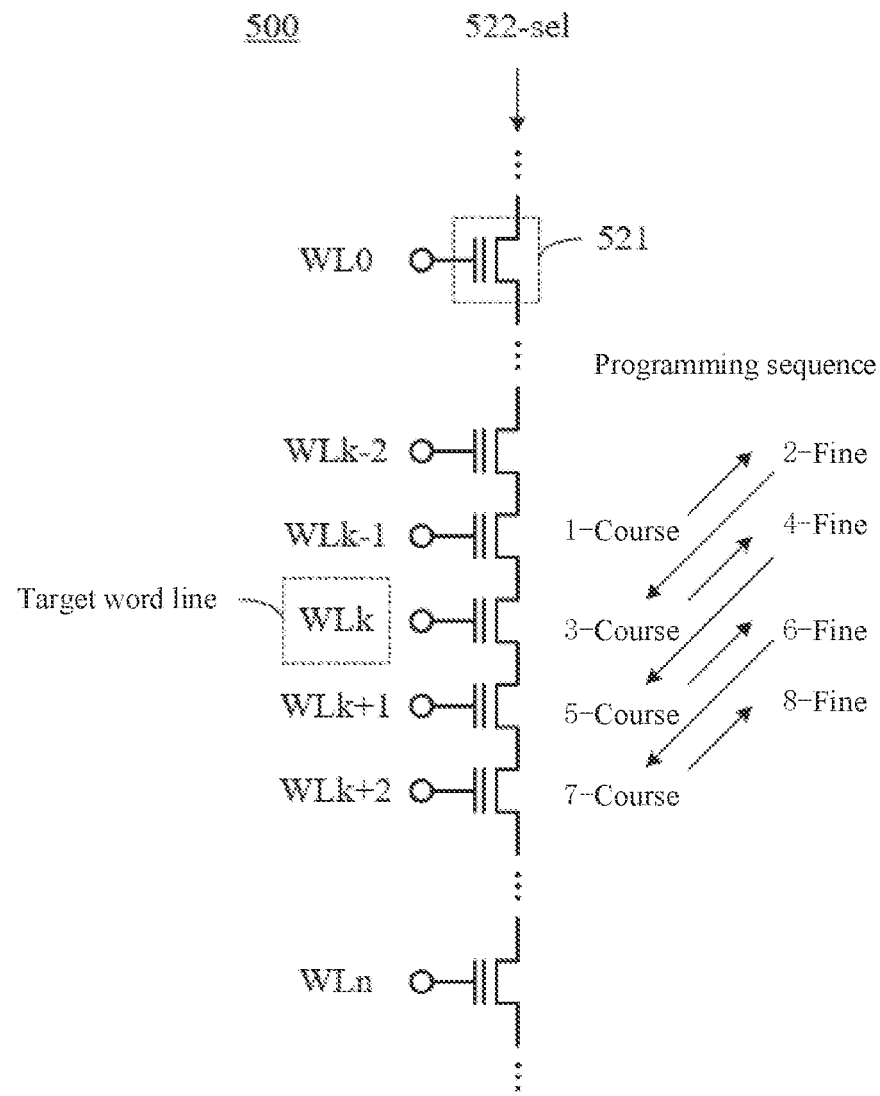
FIG. 8 is a diagram illustrating a sequence of selecting a target word line and performing a first sub-programming operation or a second sub-programming operation in some implementations.

Specifically, referring to FIG. 8, which shows a schematic diagram of an order of selecting a target word line WLk and performing a first sub-programming operation or a second sub-programming operation in some implementations. As shown in FIG. 8, the above order is described below by taking programming multiple memory cells 421 in the NAND string 522-sel as an example, for example: performing the first sub-programming operation on the memory cell 421 coupled to the word line WL0, . . . , performing the first sub-programming operation on the memory cell 421 coupled to the word line WLk−1 (shown as "1-Course" in FIG. 8), performing the second sub-programming operation on the memory cell 421 coupled to the word line WLk−2 (shown as "2-Fine"), performing the first sub-programming operation on the memory cell 421 coupled to the word line WLk (shown as "3-Course"), performing the second sub-programming operation on the memory cell 421 coupled to the word line WLk−1 (shown as "4-Fine"), performing the first sub-programming operation on the memory cell 421 coupled to the word line WLk+1 (shown as "5-Course"), performing the second sub-programming operation on the memory cell 421 coupled to the word line WLk (shown as "6-Fine"), performing the first sub-programming operation on the memory cells 421 connected to the word line WLk+2 (shown as "7-Course"), performing the second sub-programming operation on the memory cells 421 coupled to the word line WLk+1 (shown as "8-Fine"), . . . , until performing the second sub-programming operation on the memory cells 421 coupled to the word line WLn.

It is noted that before performing the first sub-programming operation, the above-mentioned pre-charge operation may be performed, and before performing the second sub-programming operation, the above-mentioned pre-charge operation will also be performed.

Further, in the examples shown in FIGS. 7*a* to 7*f*, the target word line WLk and a plurality of word lines 429 located on one side of the target word line WLk and to which the memory cell 421 that has been programmed is coupled are taken as a first group, and the target word line WLk and a plurality of word lines 429 located on one side of the target word line WLk and to which the memory cell 421 that has not been programmed is coupled are taken as a second group. As shown in FIGS. 7*a* to 7*f*, the first group includes: target word line WLk, word line WLk−1, word line WLk−2 to word line WL0, and the second group includes: target word line WLk, word line WLk+1, word line WLk+2 to word line WLn.

Specifically, in the pre-charge operation performed before the first sub-programming operation or the second sub-programming operation, a bias voltage equivalent to a power supply voltage (VDD, 2.2V, for example) or a bias voltage equivalent to a ground voltage (VSS, 0V, for example) may be applied to each word line WL in the first group, and a bias voltage equivalent to a power supply voltage or a bias voltage equivalent to a ground voltage may be applied to each word line WL in the second group.

Figure 7A:
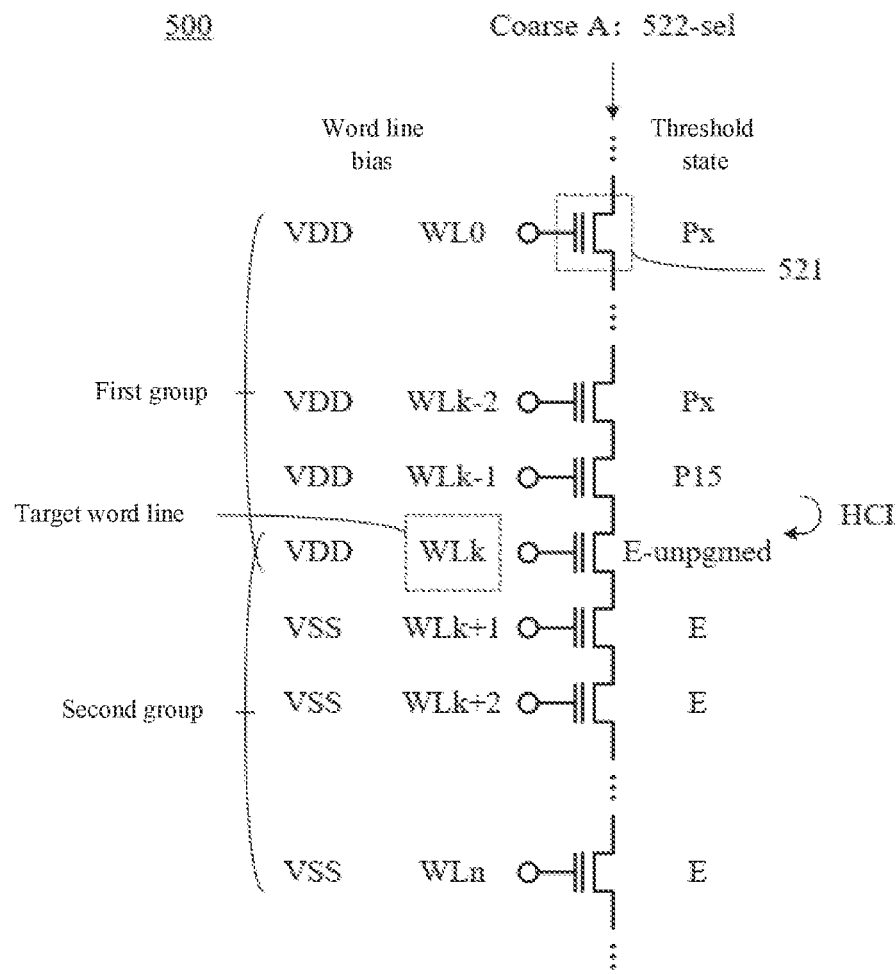
FIGS. 7a to 7f are schematic structural diagrams of a memory including threshold state flags of memory cells in a NAND string during a pre-charge operation in some implementations.

Referring to FIG. 7*a*, which shows that in the pre-charge operation performed before the first sub-programming operation, a bias voltage equivalent to the power supply voltage is applied to each word line WL in the first group, and a bias voltage equivalent to the ground voltage is applied to the word lines WL in the second group. This configuration is marked as "Coarse A" in FIG. 7*a*. Further, since the power supply voltage is greater than the ground voltage, the bias voltage acting on the target word line WLk is, therefore, the power supply voltage.

Specifically, in the NAND string 522-sel, the memory cells 421 coupled to the word line WLk−2 to the word line WL0 are in one of the multi-level threshold states. Therefore, the threshold state of these memory cells 421 is marked as "Px" in FIG. 7*a*. The memory cells 421 coupled to the word line WLk+1, word line WLk+2 to word line WLn are in the erased state where the first sub-programming operation has not been performed. Therefore, the threshold state of these memory cells 421 is marked as "E" in FIG. 7*a*.

Further, the memory cell 421 in the NAND string 522-sel coupled to the target word line WLk is in an erased state where the first sub-programming operation has not been performed during the pre-charge operation, although the sub-area A4 to which the NAND string 522-sel belongs is the selected sub-area A4. Therefore, the threshold state of the memory cell 421 is marked as "E-unpgmed" in FIG. 7*a*.

The inventors of the present disclosure found that in the pre-charge operation performed before the first sub-programming operation, the threshold state into which the memory cell 421 coupled to the word line WLk−1 is programmed will affect the hot carrier injection effect that the memory cell 421 coupled to the target word line WLk is subjected to. Therefore, then the memory cell 421 coupled to the word line WLk−1 being programmed into the highest-level threshold state among the multi-level threshold states is taken as an example for illustration. Moreover, in FIG. 7*a*, each memory cell 421 in the memory 400 is exemplified as the quad-level cell (QLC) described above, and the threshold state of the memory cell 421 coupled to the word line WLk−1 is marked as "P15".

It should be noted that the voltage difference between the bias voltage VDD applied to the target word line WLk and the threshold voltage corresponding to the threshold state (E-unpgmed) of the memory cell 421 coupled thereto may generate a first channel potential at the corresponding channel, and the voltage difference between the bias voltage VDD applied to the word line WLk-1, and the threshold voltage corresponding to the threshold state (P15) of the memory cell 421 coupled thereto may generate a second channel potential at the corresponding channel. Wherein, the first channel potential is greater than the second channel potential, and the difference value between the first channel potential and the second channel potential is relatively large, so there is a strong electric field in the channel, as shown in FIG. 7*a*, leading to the hot carrier injection effect as described above is generated in a direction pointing to channel of the memory cell 421 coupled to the target word line WLk at the channel of the memory cell 421 coupled to the word line WLk-1, so that after the memory cell 421 coupled to the target word line WLk is programmed into the target threshold state, its actual threshold voltage is greater than the target threshold voltage corresponding to the above-mentioned target threshold state, which results in a smaller read window during the subsequent read operation of the memory cell 421.

Figure 7B:
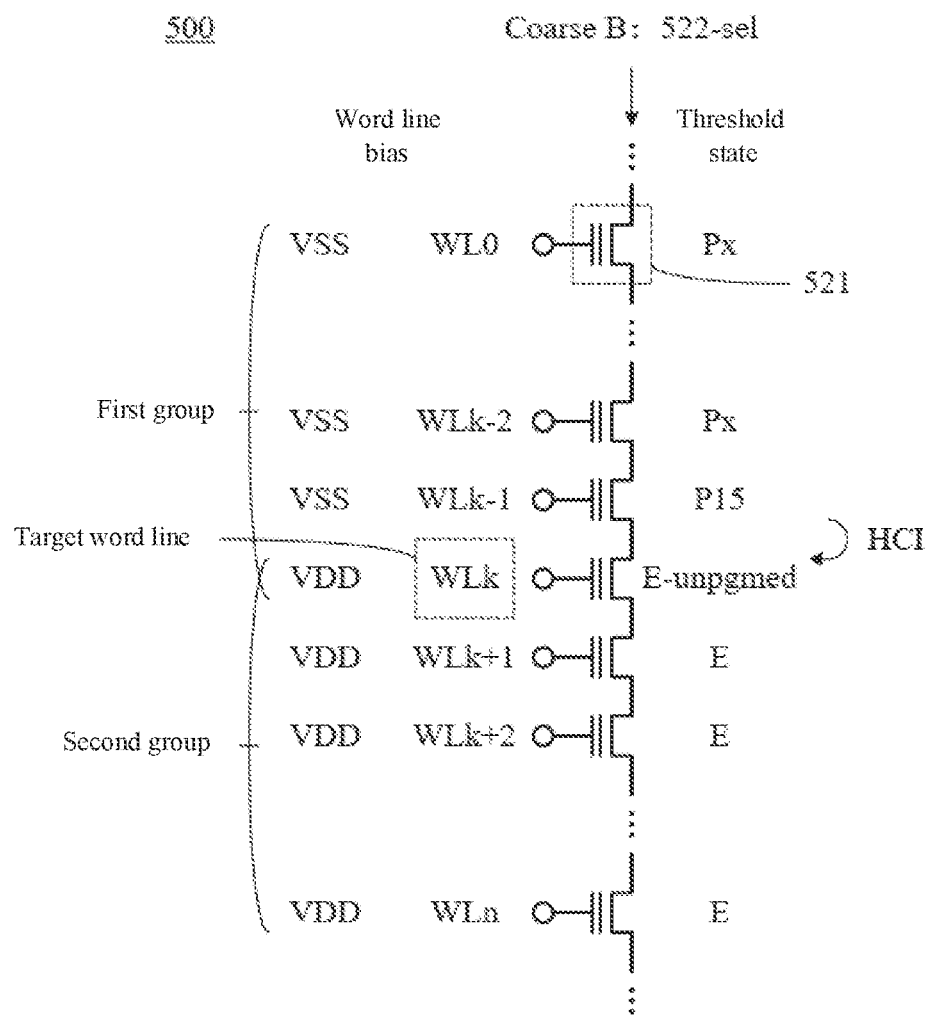

With reference to FIG. 7*b*, which shows that in the pre-charge operation performed before the first sub-programming operation, a bias voltage equivalent to the ground voltage is applied to each word line WL in the first group, and a bias voltage equivalent to the power supply voltage is applied to each word line WL in the second group. In FIG. 7*b*, this configuration is marked as "Coarse B." Further, since the power supply voltage is greater than the ground voltage, the bias voltage acting on the target word line WLk is the power supply voltage.

Compared with the example in FIG. 7*a*, the threshold states of the memory cells 421 coupled to the word line WL0 to the word line WLn are all the same in the NAND string 522-sel shown in FIG. 7*b*. Therefore, the flags of the threshold states of each memory cell 421 in FIG. 7*a* and FIG. 7*b* are also the same and will not be repeated here.

It is noted that, in the example of FIG. 7*b*, the above-mentioned hot carrier injection effect also occurs in a direction in which the channel of the memory cell 421 coupled to the word line WLk−1 points to the channel of the memory cell 421 coupled to the target word line WLk, and causes problems similar to those in the example of FIG. 7a in the memory 400, which will not be repeated here.

Figure 7C:
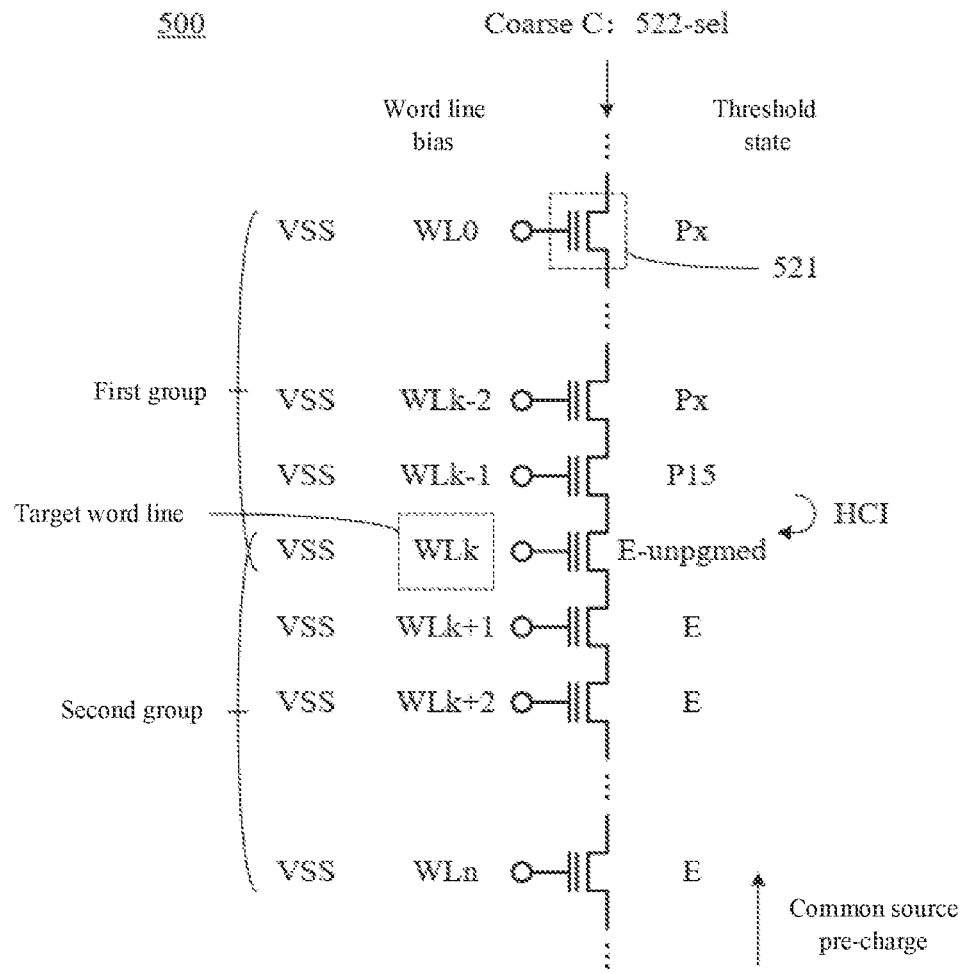

With reference to FIG. 7c, which shows that in the pre-charge operation performed before the first sub-programming operation, a bias voltage equivalent to the ground voltage is applied to the word line WL0 to the word line WLn. In FIG. 7c, the configuration is marked as "Coarse C".

Compared with the example of FIG. 7a, the threshold states of the memory cells 421 coupled to the word line WL0 to the word line WLn are all the same in the NAND string 522-sel shown in FIG. 7c. Therefore, the flags of the threshold states of each memory cell 421 in FIG. 7a and FIG. 7c are also the same, which will not be repeated here.

It is noted that, in the example of FIG. 7c, the hot carrier injection effect described above also occurs in a direction in which the channel of the memory cell 421 coupled to the word line WLk−1 points to the channel of the memory cell 421 coupled to the target word line WLk, and causes problems similar to those in the example of FIG. 7a in the memory 400.

Further, as shown in FIG. 7c, a certain voltage is pre-charged from the source line coupled to the NAND string 522-sel into the channel during the pre-charge operation. Furthermore, since the threshold voltage corresponding to the threshold state of the memory cell 421 coupled to the word line WLk−1 is higher, the bias voltage equivalent to the ground voltage applied to the word line WLk−1 will therefore causes the memory cell 421 coupled thereto to be in a cut-off state which is not turned on, and the bias voltage equivalent to the ground voltage applied to the word line WLk can make the memory cell 421 coupled thereto in a turn-on state. Thus, the voltage precharged from the source line further increases the first channel potential described above without increasing the second channel potential, thereby further increasing the difference value between the first channel potential and the second channel potential, leading to a more serious hot carrier injection effect in the channel.

Figure 7D:
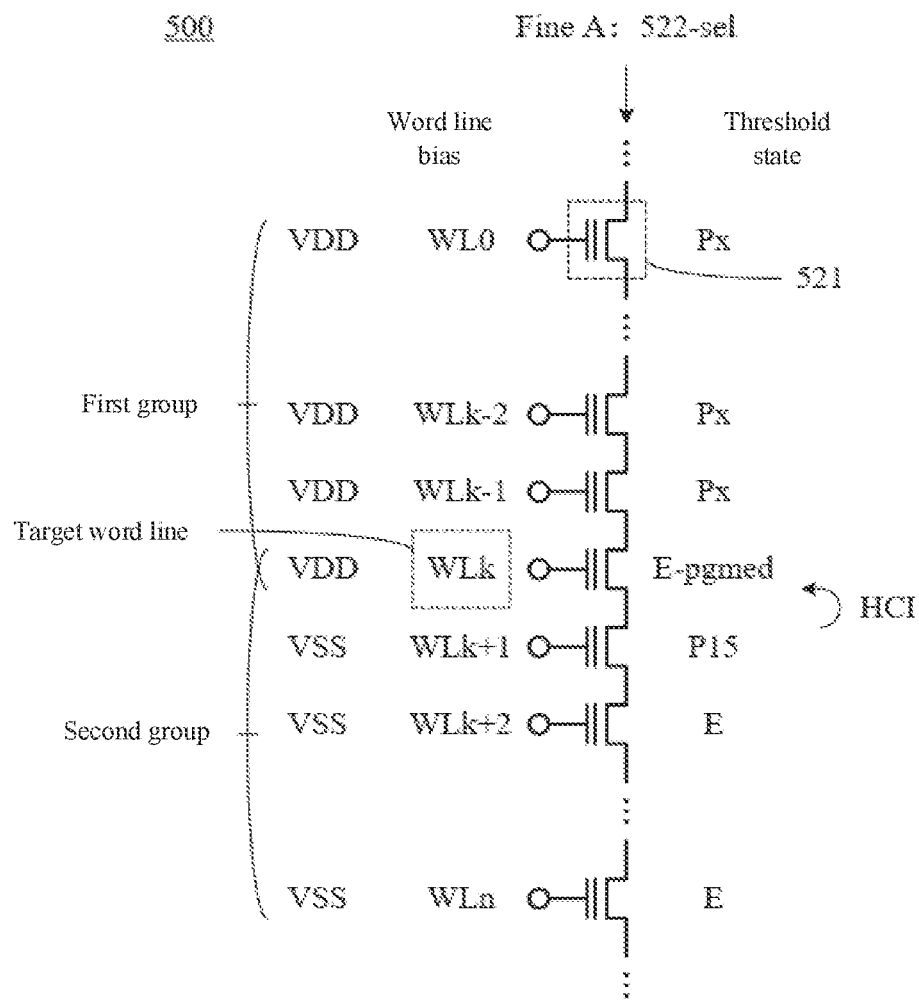

Referring to FIG. 7d, which shows that in the pre-charge operation performed before the second sub-programming operation, a bias voltage equivalent to the power supply voltage is applied to each word line WL in the first group, and a bias voltage equivalent to the ground voltage is applied to each word line WL in the second group. In FIG. 7d, this configuration is marked as "Fine A". Further, since the power supply voltage is greater than the ground voltage, the bias voltage acting on the target word line WLk is the power supply voltage.

Specifically, the memory cells 421 in the NAND string 522-sel that are coupled to the word line WLk−1, word line WLk−2 to word line WL0 are in one of the multi-level threshold states. Therefore, the threshold states of these memory cells 421 are marked as "Px" in FIG. 7d. The memory cells 421 coupled to the word line WLk+2 to word line WLn are in the erased state where the first sub-programming operation has not been performed. Therefore, the threshold state of these memory cells 421 is marked as "E" in FIG. 7d.

Further, in the example of FIG. 7d, the memory cell 421 coupled to the target word line WLk has been subjected to the first sub-programming operation and programmed into the erased state. Therefore, the threshold state of the memory cell 421 is marked as "E-pgmed" in FIG. 7d.

The inventors of the present disclosure found that, in the pre-charge operation performed before the second sub-programming operation, the threshold state into which the memory cell 421 coupled to the word line WLk+1 is programmed will affect the hot carrier injection effect that the memory cell 421 coupled to the target word line WLk is subjected to. Therefore, next, the memory cell 421 coupled to the word line WLk+1 being programmed into the highest-level threshold state among the multi-level threshold states is taken as an example for illustration. Moreover, in FIG. 7d, each memory cell 421 in the memory 500 is exemplified as an example of the quad-level cell (QLC) described above, and the threshold state of the memory cell 421 coupled to the word line WLk+1 is marked as "P15".

It is noted that the hot carrier injection effect described above will occur in the direction which the channel of the memory cell 421 coupled to the word line WLk+1 points to the channel of the memory cell 421 coupled to the target word line WLk, so that the threshold voltage of the programmed memory cell 421 coupled to the target word line WLk will increase, and will further cause a smaller read window during the subsequent read operation thereto.

Figure 7E:
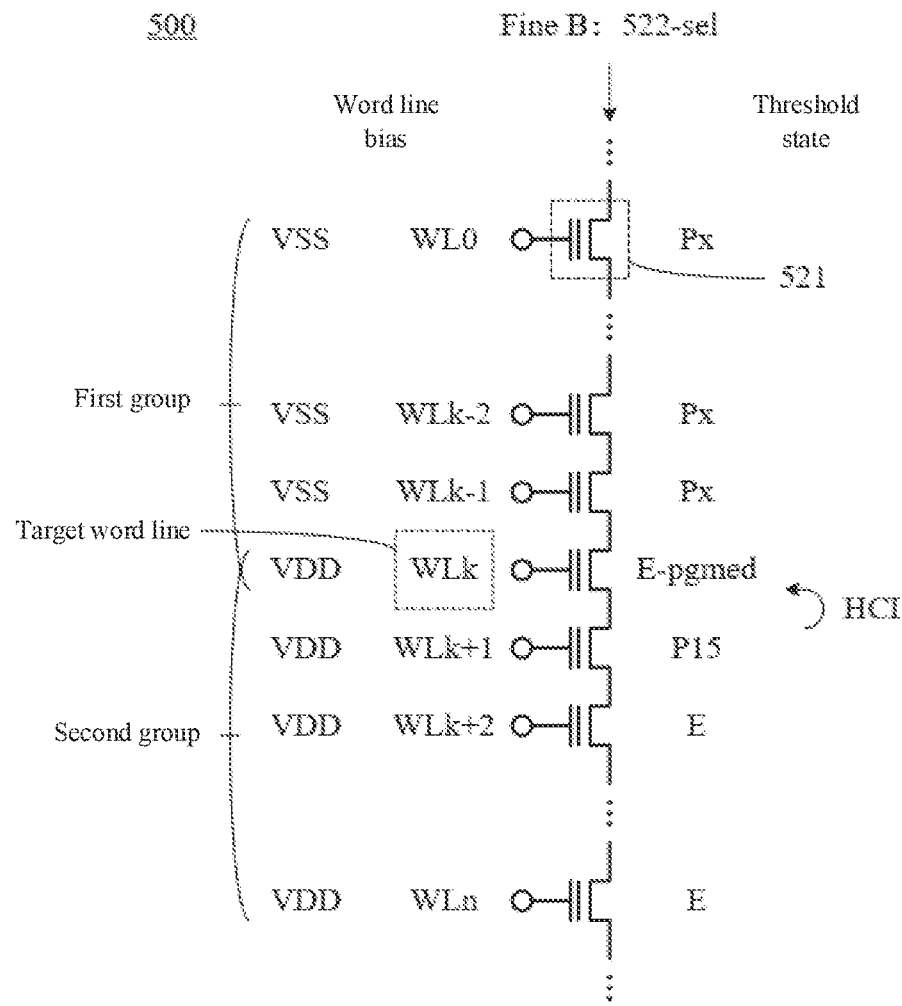

With reference to FIG. 7e, which shows that in the pre-charge operation performed before the second sub-programming operation, a bias voltage equivalent to the ground voltage is applied to each word line WL in the first group, and a bias voltage equivalent to the power supply voltage is applied to each word line WL in the second group. Moreover, in FIG. 7e, this configuration is marked as "Fine B." Further, since the power supply voltage is greater than the ground voltage, the bias voltage acting on the target word line WLk is the power supply voltage.

Compared with the example of FIG. 7d, the threshold states of the memory cells 421 coupled to the word line WL0 to the word line WLn are all the same in the NAND string 522-sel shown in FIG. 7e. Therefore, the flags of the threshold states of each memory cell 421 in FIG. 7e and FIG. 7d are also the same, which will not be repeated here.

It is noted that, in the example of FIG. 7e, the hot carrier injection effect described above also occurs in the direction in which the channel of the memory cell 421 coupled to the word line WLk+1 points to the channel of the memory cell 421 coupled to the target word line WLk, and causes problems similar to those in the example of FIG. 7d in the memory 400, which will not be repeated here.

Figure 7F:
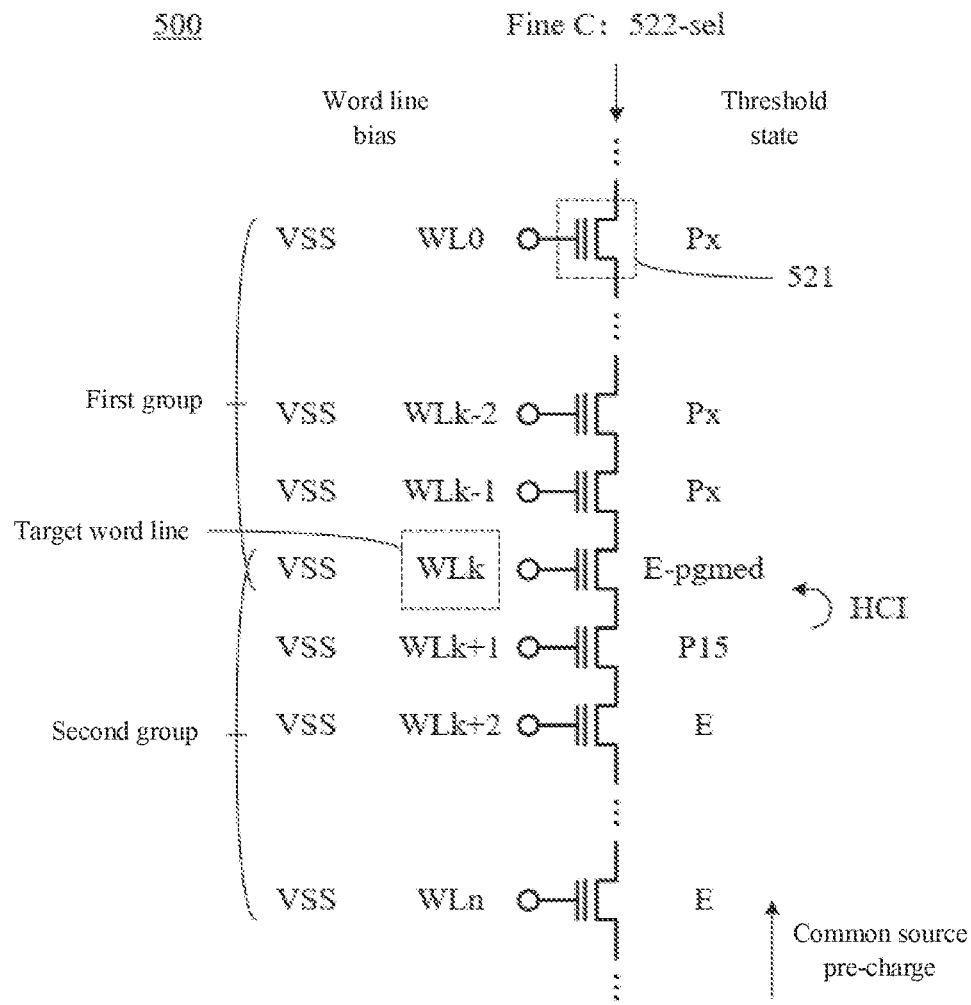

Referring to FIG. 7f, which shows that in the pre-charge operation performed before the second sub-programming operation, a bias voltage equivalent to the ground voltage is applied to the word line WL0 to the word line WLn. As shown in FIG. 7c, this configuration is marked as "Fine C."

Compared with the example in FIG. 7d, the threshold states of the memory cells 421 coupled to the word line WL0 to the word line WLn are all the same in the NAND string 522-sel shown in FIG. 7f. Therefore, the flags of the threshold states of each memory cell 421 in FIG. 7f and FIG. 7d are also the same, which will not be repeated here.

It is noted that, in the example of FIG. 7f, the above-mentioned hot carrier injection effect also occurs in the direction in which the channel of the memory cell 421 coupled to the word line WLk+1 points to the channel of the memory cell 421 coupled to the target word line WLk, and causes problems in the memory 400 similar to those in the example of FIG. 7d, which will not be repeated here.

Figure 10:
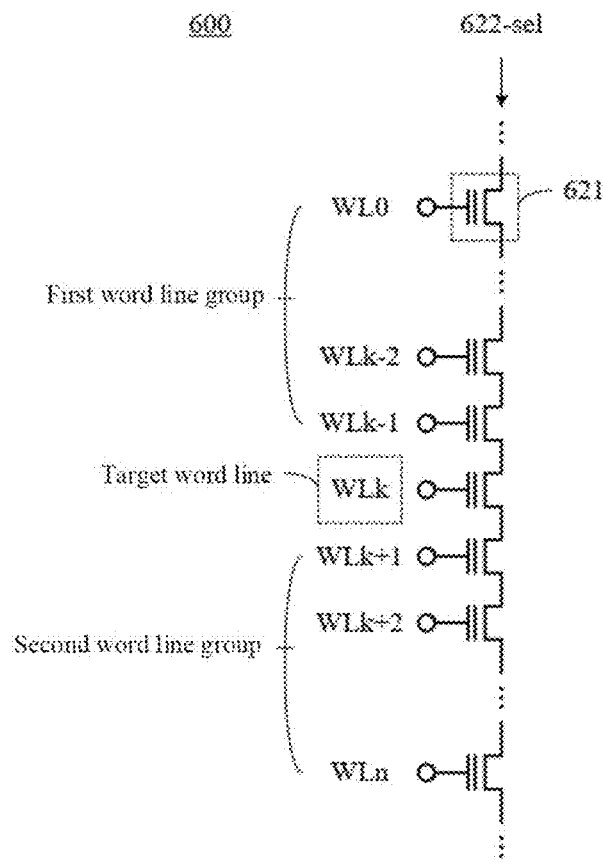
FIG. 10 is a schematic structural diagram of a memory including a NAND string during a pre-charge operation according to an implementation of the present disclosure.

Next, referring to FIG. 10 and FIG. 11, FIG. 10 shows a schematic structural diagram of a memory 500 including a NAND string 622-sel in a pre-charge operation according to an implementation of the present disclosure, and FIG. 11 shows a schematic flow chart of the operation method according to an implementation of the present disclosure.

To solve the problems described above and other problems, the inventors of the present disclosure have proposed an operation method for a memory 500. Wherein, as shown in FIG. 10, the memory 500 includes at least the target word line WLk and a first word line group and a second word line group that are respectively stacked on both sides of the target word line WLk.

Specifically, the first word line group includes a plurality of first word lines (including word line WLk−1, word line WLk−2 to word line WL0), and the second word line group includes a plurality of second word lines (including word line WLk+1, word line WLk+2 to word line WLn). Further, as shown in FIG. 11, the steps included in this operation method can reference the precharging step S101 and the programming step S102 described above.

Further, in the implementation shown in FIG. 10, the first bias voltage signal has a first voltage value V1, the second bias voltage signal has a second voltage value V2, and the third bias voltage signal has a third voltage value V3, where the magnitude relationship among the first voltage value V1, the second voltage value V2 and the third voltage value V3 is different from the above-mentioned implementations.

Figure 12:
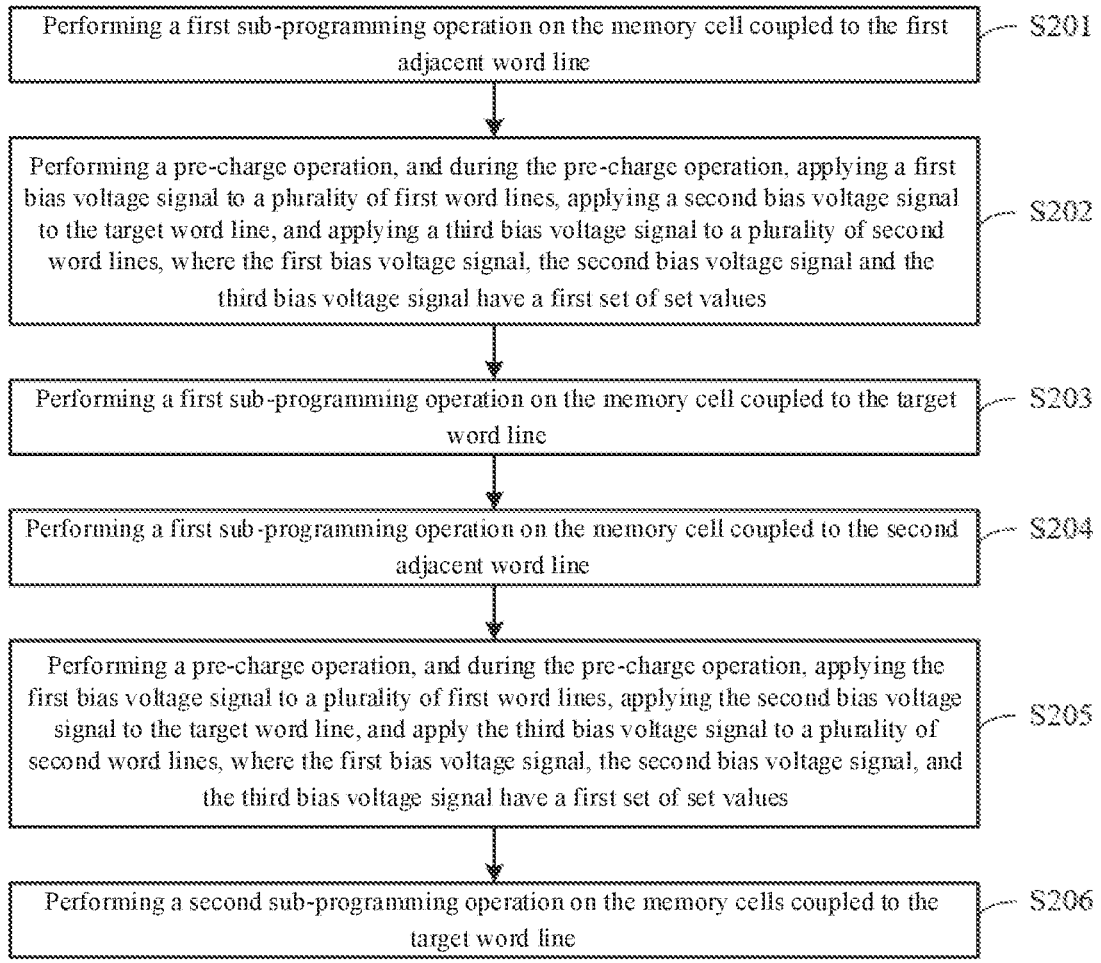
FIG. 12 is a further schematic flowchart of an operation method according to an implementation of the present disclosure.

Specifically, referring to the further schematic flowchart of the operation method of the further implementation of the present disclosure shown in FIG. 12, where the first word line group includes a first adjacent word line WLk−1 adjacent to the target word line WLk, and the second word line group includes a second adjacent word line WLk+1 adjacent to the target word line WLk. As illustrated in FIG. 12, the operation method of the memory 500 in the example of FIG. 10 may specifically include the following steps:

First step S201: performing a first sub-programming operation on the memory cell 421 coupled to the first adjacent word line WLk−1;

Second step S202: performing a pre-charge operation, and during the pre-charge operation, applying a first bias voltage signal to a plurality of first word lines (word line WLk−1, word line WLk−2 to word line WL0), applying a second bias voltage signal to the target word line WLk, and applying a third bias voltage signal to a plurality of second word lines (word line WLk+1, word line WLk+2 to word line WLn), where the first bias voltage signal, the second bias voltage signal and the third bias voltage signal have a first set of set values;

Third step S203: performing a first sub-programming operation on the memory cell 421 coupled to the target word line WLk;

Fourth step S204: performing a first sub-programming operation on the memory cell 421 coupled to the second adjacent word line WLk+1;

Fifth step S205: performing a pre-charge operation, and during the pre-charge operation, applying the first bias voltage signal to a plurality of first word lines (word line WLk−1, word line WLk−2 to word line WL0), applying the second bias voltage signal to the target word line WLk, and apply the third bias voltage signal to a plurality of second word lines (word line WLk+1, word line WLk+2 to word line WLn), where the first bias voltage signal, the second bias voltage signal, and the third bias voltage signal have a first set of set values; and Sixth step S206: performing a second sub-programming operation on the memory cells 421 coupled to the target word line WLk.

It should be noted that, according to this implementation, the same set of set values of the first bias voltage signal, the second bias voltage signal and the third bias voltage signal are selected and used in the second step S202 and the fifth step S205, and in the second step S202, the hot carrier injection effect experienced by the memory cell 421 coupled to the target word line WLk is mainly affected by the memory cell 421 coupled to the word line WLk−1 programmed into a higher-level threshold state, and in the fifth step S205, the hot carrier injection effect on the memory cell 421 coupled to the target word line WLk is mainly affected by the memory cell 421 coupled to word line WLk+1 programmed into a higher-level threshold state. Therefore, in this implementation, the first voltage value V1 is greater than the second voltage value V2, and the third voltage value V3 is greater than the second voltage value V2.

It should be further explained that similar to what was described above using FIG. 9 as an example, the set values of the first bias voltage signal, the second bias voltage signal, and the third bias voltage signal (that is, the first voltage value V1, the second voltage value V2, and the third voltage value V3) are also related to both the preset difference value between the highest-level maximum threshold voltage and the lowest-level minimum threshold voltage of the memory cell 421 and the above-mentioned threshold voltage value according to this implementation.

Specifically, in this implementation, descriptions are also made by taking as an example the case where the memory 500 which the memory cell 421 belongs to has a target process size and will be applied at a target ambient temperature, and has a target threshold for inducing the above-mentioned hot carrier injection effect. In the following description, the highest-level threshold state into which the memory cell 421 can be programmed is denoted as Pmax, and the highest-level maximum threshold voltage that the memory cell 421 can have in the highest-level threshold state Pmax is denoted as V_Pmax. Meanwhile, the lowest threshold state into which the memory cell 421 can be programmed is the erased state E, and the lowest-level minimum threshold voltage that the memory cell 421 can have in the erased state is denoted as V_Pmin.

To be more specific, to ensure that in the second step S202, the applied first bias voltage signal with the first voltage value V1 and the second bias voltage signal with the second voltage value V2 can also avoid the occurrence of the above-mentioned hot carrier injection effect in the case in which there is a maximum threshold voltage difference value between two adjacent memory cells 421 respectively coupled to the first adjacent word line WLk−1 and the target word line WLk, the relationship between the above-mentioned first voltage value V1 and the second voltage value V2 can satisfy the following relationship:

$|(V1-V\_Pmax)-(V2-V\_Pmin)|<|$target threshold voltage value$|$.

Specifically, to ensure that in the fifth step S205, the applied third bias voltage signal with the third voltage value V3 and the second bias voltage signal with the second voltage value V2 can also avoid the occurrence of the above-mentioned hot carrier injection effect in the case in which there is a maximum threshold voltage difference value between two adjacent memory cells 421 respectively coupled to the second adjacent word line WLk+1 and the target word line WLk, the relationship between the above-mentioned third voltage value V3 and the second voltage value V2 can satisfy the following relationship:

$|(V3-V\_Pmax)-(V2-V\_Pmin)|<|$target threshold voltage value$|$.

It should be understood that there is no fixed magnitude relationship between the above-mentioned first voltage value V1 and the above-mentioned third voltage value V3. In some implementations, the first voltage value V1, the second voltage value V2 and the third voltage value V3 may be different from each other.

Figure 13:
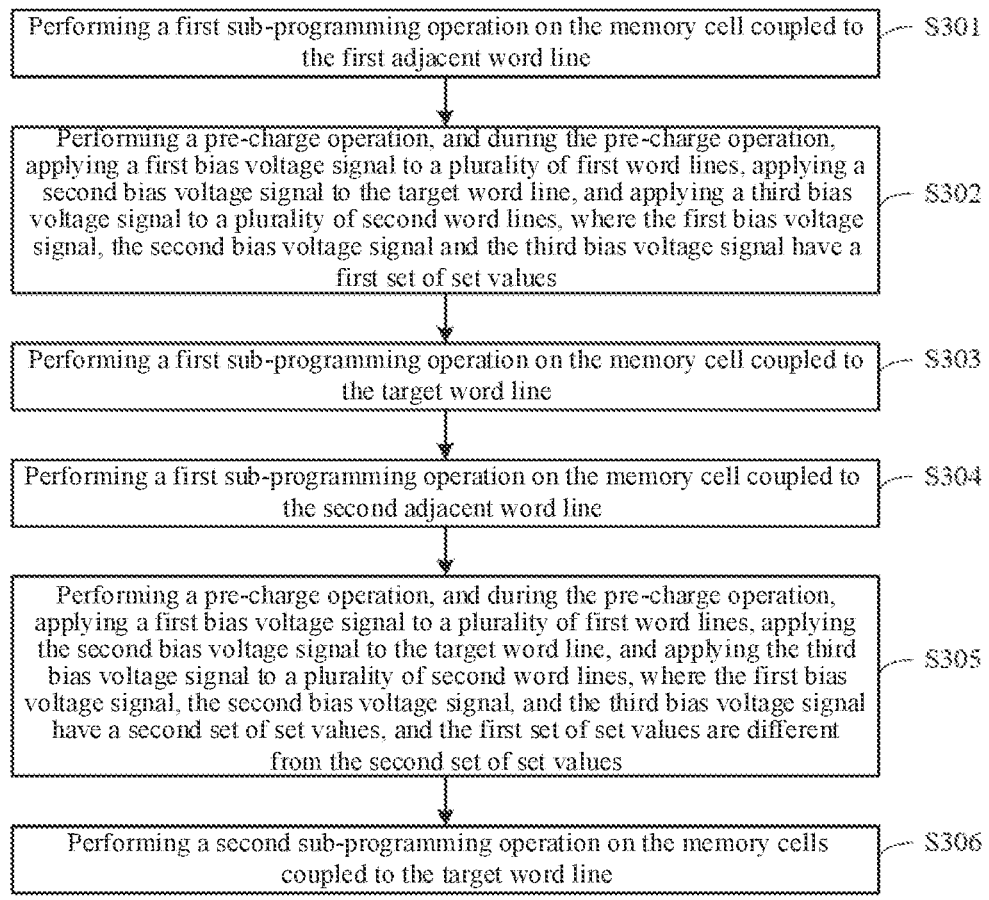
FIG. 13 is a further schematic flowchart of an operation method according to an implementation of the present disclosure.

Further, referring to the further schematic flowchart of the operation method of the implementation of the present disclosure shown in FIG. 13, where the first word line group includes a first adjacent word line WLk−1 adjacent to the target word line WLk, and the second word line group includes the second adjacent word line WLk+1 adjacent to the target word line WLk. As shown in FIG. 13, the specific steps of the operation method of the memory 500 in the example of FIG. 10 can also be as follows:

First step S301: performing a first sub-programming operation on the memory cell 421 coupled to the first adjacent word line WLk−1;

Second step S302: performing a pre-charge operation, and during the pre-charge operation, applying a first bias voltage signal to a plurality of first word lines (word line WLk−1, word line WLk−2 to word line WL0), applying a second bias voltage signal to the target word line WLk, and applying a third bias voltage signal to a plurality of second word lines (word line WLk+1, word line WLk+2 to word line WLn), where the first bias voltage signal, the second bias voltage signal and the third bias voltage signal have a first set of set values;

Third step S303: performing a first sub-programming operation on the memory cell 421 coupled to the target word line WLk;

Fourth step S304: performing a first sub-programming operation on the memory cell 421 coupled to the second adjacent word line WLk+1;

Fifth step S305: performing a pre-charge operation, and during the pre-charge operation, applying a first bias voltage signal to a plurality of first word lines (word line WLk−1, word line WLk−2 to word line WL0), applying the second bias voltage signal to the target word line WLk, and applying the third bias voltage signal to a plurality of second word lines (word line WLk+1, word line WLk+2 to word line WLn), where the first bias voltage signal, the second bias voltage signal, and the third bias voltage signal have a second set of set values, and the first set of set values are different from the second set of set values; and Sixth step S306: performing a second sub-programming operation on the memory cells 421 coupled to the target word line WLk.

It should be noted that, in this implementation, since a set of set values for the first bias voltage signal, the second bias voltage signal and the third bias voltage signal are selected to be respectively used in the second step S202 and the fifth step S205, the values of the first bias voltage signal, the second bias voltage signal and the third bias voltage signal among these two sets of set values will not interfere with each other, and have higher flexibility. Therefore, the reliability of the memory 500 is further improved.

Specifically, the voltage value of the first bias voltage signal (represented as V11 below) is greater than the voltage value of the second bias voltage signal (represented as V12 below), among the above-mentioned first set of set values, and similar to the above description, the relationship between the voltage value V11 and the voltage value V12 can satisfy the following specific relationship: $|(V11-V\_Pmax)-(V12-V\_Pmin)|<|$target threshold voltage value$|$.

Specifically, the voltage value of the third bias voltage signal (represented as V23 hereinafter) is greater than the voltage value of the second bias voltage signal (represented as V22 hereinafter), among the above-mentioned second set of set values, and similar to the above description, the relationship between the voltage value V23 and the voltage value V22 can satisfy the following specific relationship:

$$|(V23-V\_Pmax)-(V22-V\_Pmin)|<|\text{target threshold voltage value}|.$$

It should be understood that the voltage value of the third bias voltage signal has no fixed magnitude relationship with the voltage value V11 and the voltage value V12, among the first set of set values, and in some implementations, the voltage value of the third bias voltage signal, the voltage value V11 and the voltage value V12 may be different from each other among the first set of set values. Similarly, the voltage value of the first bias voltage signal has no fixed magnitude relationship with the voltage value V23 and the voltage value V22 among the second set of set values, and in some implementations, the voltage value of the first bias voltage signal value, the voltage value V23 and the voltage value V22 may be different from each other.

It should be noted that, in the operation methods provided in the various implementations of the present disclosure, the first bias voltage signal applied to the first word line group, the second bias voltage signal applied to the target word line, and the third bias voltage signal applied to the second word line group are independently controlled, thereby effectively avoiding the hot carrier injection effect in the memory.

Based on the same idea, the present disclosure also provides a memory, which includes at least a memory array and a peripheral circuit, where the memory array includes at least a target word line, and a first word line group and a second word line group stacked on both sides of the target word line, respectively. The first word line group includes a plurality of first word lines, the second word line group includes a plurality of second word lines, and the peripheral circuit is coupled with the memory array and is configured to apply a first bias voltage signal to a plurality of first word lines, apply a second bias voltage signal to a target word line, and apply a third bias voltage signal to a plurality of second word lines, during the pre-charge operation; and apply a program voltage signal to the target word line during a programming operation.

In some examples, the peripheral circuit is further configured to independently control the first bias voltage signal, the second bias voltage signal, and the third bias voltage signal.

In some examples, the first bias voltage signal has a first voltage value, the second bias voltage signal has a second voltage value, the third bias voltage signal has a third voltage value, and the first voltage value, the second voltage value, and the third voltage values are different from each other.

In some examples, the programming operation includes a first sub-programming operation and a second sub-programming operation. The memory array further includes a plurality of memory cells. The first word line group includes a first adjacent word line adjacent to the target word line, and the second word line group includes a second adjacent word line adjacent to the target word line. The peripheral circuit is further configured to perform a first sub-programming operation on memory cells coupled to a first adjacent word line; perform a pre-charge operation, wherein the first bias voltage signal, the second bias voltage signal, and the third bias voltage signal have a first set of set values; perform a first sub-programming operation on the memory cells coupled to the target word line; perform a first sub-programming operation on memory cells coupled to a second adjacent word line; perform the pre-charge operation, where the first bias voltage signal, the second bias voltage signal, and the third bias voltage signal have a second set of set values; and perform a second sub-programming operation on memory cells coupled to the target word line, wherein the first set of set values is different from the second set of set values.

In some examples, the voltage value of the first bias voltage signal is greater than the voltage value of the second bias voltage signal, among the first set of set values, and the voltage value of the third bias voltage signal is greater than the voltage value of the second bias voltage signal, among the second set of set values.

In some examples, memory cells can be programmed to be in one of multi-level threshold states.

It should be noted that the technical solution adopted in the above-mentioned memory and the technical solution adopted in the operation method of the memory mentioned above belong to the same inventive concept, and both have the same technical features. The nouns appearing in the operation method of the memory and the technical solution of the present disclosure have been described in detail, and then the nouns appearing here can then be understood according to the meaning of the foregoing description, and will not be repeated here.

Based on the same idea, the present disclosure also provides a memory system, which includes at least a memory and a controller, wherein the controller is coupled to the memory.

It should be noted that the above-mentioned memory system includes the memory as described above, both of which have the same technical features. Nouns appearing in the memory, the operation method of the memory and the technical solution of the present disclosure have been described in detail above, and then the nouns appearing here can be understood according to the meaning of the foregoing description, and will not be repeated here.

Based on the same idea, the present disclosure also provides an electronic device, which includes at least a memory system.

It should be noted that the above-mentioned electronic device includes the memory system as described above, and the memory system further includes the aforementioned memory, both of which have the same technical features. Nouns appearing in the memory, the operation method of the memory and the technical solution of the present disclosure have been described in detail above, and then the nouns appearing here can be understood according to the meaning of the foregoing description, and will not be repeated here.

In view of the foregoing, an operation method for memory, a memory, a memory system, and an electronic device are provided in the present disclosure. The memory includes at least a target word line and a first word line group and a second word line group stacked on both sides of the target word line. The first word line group includes a plurality of first word lines, and the second word line group includes a plurality of second word lines. Wherein, the operation method includes at least: during a pre-charge operation, applying a first bias voltage signal to the plurality of first word lines, applying a second bias voltage signal to a target word line, and applying a third bias voltage signal to the plurality of second word lines, and then, during a programming operation, applying a program voltage signal to a target word line. According to the present disclosure, hot carrier injection effect can be prevented from occurring in the memory by independently controlling the first bias voltage signal, the second bias voltage signal, and the third bias voltage signal, and the reliability of the memory is effectively improved.

In addition to the above implementations, there may be other implementations for the present disclosure. All technical solutions formed by equivalent substitution or equivalent replacement fall within the scope of protection claimed by the present disclosure.

In summary, although the present disclosure has disclosed the implementations above, the above implementations are not intended to limit the present disclosure. Those of ordinary skill in the art can make various modifications and adaptations without departing from the spirit and scope of the present disclosure. Therefore, the scope of protection of the present disclosure is defined by the claims.

What is claimed is:

1. A method for programming a memory, the memory comprising at least a target word line and a first word line group and a second word line group stacked on both sides of the target word line, respectively, the first word line group comprising first word lines, the second word line group comprising second word lines, the method comprising:
    applying a first bias voltage signal to the first word lines, applying a second bias voltage signal to the target word line, and applying a third bias voltage signal to the second word lines, during a pre-charge operation; and,
    applying a program voltage signal to the target word line during a programming operation, wherein the programming operation comprises a first sub-programming operation and a second sub-programming operation, the memory further comprises memory cells, the first word line group comprising a first adjacent word line adjacent to the target word line, the second word line group comprising a second adjacent word line adjacent to the target word line, and the method further comprises:
    performing the first sub-programming operation on the memory cells coupled to the first adjacent word line;
    performing the pre-charge operation, the first bias voltage signal, the second bias voltage signal, and the third bias voltage signal having a first set of set values;
    performing the first sub-programming operation on the memory cells coupled to the target word line;
    performing the first sub-programming operation on the memory cells coupled to the second adjacent word line;
    performing the pre-charge operation, the first bias voltage signal, the second bias voltage signal, and the third bias voltage signal having a second set of set values; and,
    performing the second sub-programming operation on the memory cells coupled to the target word line, the first set of set values being different from the second set of set values.

2. The method according to claim 1, wherein the first bias voltage signal has a first voltage value, the second bias voltage signal has a second voltage value, the third bias voltage signal has a third voltage value, and the first voltage value, the second voltage value, and the third voltage value are different from one another.

3. The method according to claim 1, wherein a voltage value of the first bias voltage signal is greater than a voltage value of the second bias voltage signal among the first set of set values, and a voltage value of the third bias voltage signal is greater than a voltage value of the second bias voltage signal among the second set of set values.

4. The method according to claim 1, wherein the first bias voltage signal, the second bias voltage signal, and the third bias voltage signal are independently controlled during the pre-charge operation.

5. The method according to claim 1, wherein
the memory cells coupled to each of the second word lines are in an erased state, the first bias voltage signal has a first voltage value, the second bias voltage signal has a second voltage value, and the third bias voltage signal has a third voltage value;
the first voltage value is greater than the second voltage value; and
the second voltage value is equal to the third voltage value.

6. The method according to claim 1, wherein
the memory cells coupled to each of the second word lines are in an erased state.

7. The method according to claim 1, wherein
the first word line group is at a side of the target word line close to a bit line; and
the second word line group is at another side of the target word line away from the bit line.

8. A memory, comprising:
a memory array comprising at least a target word line and a first word line group and a second word line group stacked on both sides of the target word line, respectively, the first word line group comprising first word lines, the second word line group comprising second word lines; and
a peripheral circuit coupled to the memory array, and configured to:
apply a first bias voltage signal to the first word lines, apply a second bias voltage signal to the target word line, and apply a third bias voltage signal to the second word lines, during a pre-charge operation; and,
apply a program voltage signal to the target word line during a programming operation, wherein the programming operation comprises a first sub-programming operation and a second sub-programming operation, the memory array further includes memory cells, the first word line group comprises a first adjacent word line adjacent to the target word line, the second word line group comprises a second adjacent word line adjacent to the target word line, and the peripheral circuit is further configured to:
perform the first sub-programming operation on the memory cells coupled to the first adjacent word line;
perform the pre-charge operation, the first bias voltage signal, the second bias voltage signal, and the third bias voltage signal having a first set of set values;
perform the first sub-programming operation on the memory cells coupled to the target word line;
perform the first sub-programming operation on the memory cells coupled to the second adjacent word line;
perform the pre-charge operation, the first bias voltage signal, the second bias voltage signal, and the third bias voltage signal having a second set of set values; and,
perform the second sub-programming operation on the memory cells coupled to the target word line, the first set of set values being different from the second set of set values.

9. The memory according to claim 8, wherein the peripheral circuit is further configured to control the first bias voltage signal, the second bias voltage signal, and the third bias voltage signal independently.

10. The memory according to claim 8, wherein the first bias voltage signal has a first voltage value, the second bias voltage signal has a second voltage value, the third bias voltage signal has a third voltage value, and the first voltage value, the second voltage value, and the third voltage value are different from one another.

11. The memory according to claim 8, wherein a voltage value of the first bias voltage signal is greater than a voltage value of the second bias voltage signal among the first set of set values, and a voltage value of the third bias voltage signal is greater than a voltage value of the second bias voltage signal among the second set of set values.

12. The memory according to claim 8, wherein each of the memory cells is configured to be programmed to be in one of multi-level threshold states.

13. The memory according to claim 12, wherein
the multi-level threshold states comprise at least a lowest-level threshold state and a highest-level threshold state, in the lowest-level threshold state the memory has a lowest-level minimum threshold voltage, in the highest-level threshold state the memory has a highest-level maximum threshold voltage, and there is a preset difference value between the highest-level maximum threshold voltage and the lowest-level minimum threshold voltage; and
the set values of the first bias voltage signal and the second bias voltage signal are related to the preset difference value, and the set values of the third bias voltage signal and the second bias voltage signal are related to the preset difference value.

14. The memory according to claim 8, wherein
the memory cells coupled to each of the second word lines are in an erased state, the first bias voltage signal has a first voltage value, the second bias voltage signal has a second voltage value, and the third bias voltage signal has a third voltage value;
the first voltage value is greater than the second voltage value; and
the second voltage value is equal to the third voltage value.

15. A memory system, comprising:
a memory comprising:
a memory array comprising at least a target word line and a first word line group and a second word line group stacked on both sides of the target word line, respectively, the first word line group comprising first word lines, the second word line group comprising second word lines; and
a peripheral circuit coupled to the memory array, and configured to:
apply a first bias voltage signal to the first word lines, apply a second bias voltage signal to the target word line, and apply a third bias voltage signal to the second word lines, during a pre-charge operation; and,
apply a program voltage signal to the target word line during a programming operation, wherein the programming operation comprises a first sub-programming operation and a second sub-programming operation, the memory array further includes memory cells, the first word line group comprises a first adjacent word line adjacent to the target word line, the second word line group comprises a second adjacent word line adjacent to the target word line, and the peripheral circuit is further configured to:

perform the first sub-programming operation on the memory cells coupled to the first adjacent word line;

perform the pre-charge operation, the first bias voltage signal, the second bias voltage signal, and the third bias voltage signal having a first set of set values;

perform the first sub-programming operation on the memory cells coupled to the target word line;

perform the first sub-programming operation on the memory cells coupled to the second adjacent word line;

perform the pre-charge operation, the first bias voltage signal, the second bias voltage signal, and the third bias voltage signal having a second set of set values; and, perform the second sub-programming operation on the memory cells coupled to the target word line, the first set of set values being different from the second set of set values; and a controller coupled to the memory.

16. The memory system according to claim 15, wherein the peripheral circuit is further configured to control the first bias voltage signal, the second bias voltage signal, and the third bias voltage signal independently.

17. The memory system according to claim 15, wherein the first bias voltage signal has a first voltage value, the second bias voltage signal has a second voltage value, the third bias voltage signal has a third voltage value, and the first voltage value, the second voltage value, and the third voltage value are different from one another.

18. The memory system according to claim 15, wherein a voltage value of the first bias voltage signal is greater than a voltage value of the second bias voltage signal among the first set of set values, and a voltage value of the third bias voltage signal is greater than a voltage value of the second bias voltage signal among the second set of set values.

19. The memory system according to claim 15, wherein each of the memory cells is configured to be programmed to be in one of multi-level threshold states.

20. The memory system according to claim 15, wherein
the memory cells coupled to each of the second word lines are in an erased state, the first bias voltage signal has a first voltage value, the second bias voltage signal has a second voltage value, and the third bias voltage signal has a third voltage value;
the first voltage value is greater than the second voltage value; and
the second voltage value is equal to the third voltage value.

* * * * *